(12) United States Patent
Bedinger

(10) Patent No.: US 10,834,825 B1
(45) Date of Patent: Nov. 10, 2020

(54) HERMETIC CHIP ON BOARD

(71) Applicant: RAYTHEON COMPANY, Waltham, MA (US)

(72) Inventor: John M. Bedinger, Garland, TX (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 16/406,774

(22) Filed: May 8, 2019

(51) Int. Cl.
| | |
|---|---|
| H01L 23/48 | (2006.01) |
| H05K 3/22 | (2006.01) |
| H05K 1/18 | (2006.01) |
| H05K 1/11 | (2006.01) |
| H05K 1/09 | (2006.01) |

(Continued)

(52) U.S. Cl.
CPC ............ *H05K 3/22* (2013.01); *H05K 1/0204* (2013.01); *H05K 1/09* (2013.01); *H05K 1/112* (2013.01); *H05K 1/181* (2013.01); *H05K 1/183* (2013.01); *H05K 3/0035* (2013.01); *H05K 3/0047* (2013.01); *H05K 3/303* (2013.01); *H05K 3/4038* (2013.01); *H05K 3/4644* (2013.01); *H05K 2201/09509* (2013.01); *H05K 2201/10083* (2013.01); *H05K 2201/10121* (2013.01); *H05K 2201/10287* (2013.01); *H05K 2201/10522* (2013.01); *H05K 2203/107* (2013.01)

(58) Field of Classification Search
CPC .......... B32B 27/02; B32B 7/02; H01L 23/48; H01L 21/30; H01L 23/02; H01L 23/04
See application file for complete search history.

(56) References Cited

U.S. PATENT DOCUMENTS

| | | |
|---|---|---|
| 5,041,943 A | 8/1991 | Ilardi et al. |
| 5,461,545 A | 10/1995 | Leroy et al. |

(Continued)

FOREIGN PATENT DOCUMENTS

| | | |
|---|---|---|
| CN | 106711345 A | 5/2017 |
| EP | 2774755 A1 | 9/2014 |

OTHER PUBLICATIONS

Aihara et al., "Development of Multi-Layer Liquid Crystal Polymer Ka-band Receiver Modules", Proceedings of Asia-Pacific Microwave Conference 2007, pp. 1-4.

(Continued)

*Primary Examiner* — Lawrence D Ferguson
(74) *Attorney, Agent, or Firm* — Lando & Anastasi, LLP

(57) ABSTRACT

A low permeability laminate film includes one or more low moisture permeability homogeneous polymer films with a total thickness between 0.5 and ten mils without glass or ceramic fillers and with a moisture permeability measured at 37° C. and 100% RH of less than 2.6 E-05 atm·cc·mm/in$^2$·sec of air. The polymer film includes one of polychlorotrifluoroethylene, polytetrafluoroethylene, fluorinated ethylene propylene, and perfluoro alkoxy alkane. The low permeability laminate film further includes a nanolaminate including alternate combinations of nanolaminate material that is selected from the group consisting of alumina, titanium dioxide, zirconium oxide, beryllium oxide, hafnium oxide, titanium oxide, silicon nitride, tantalum nitride, silica, parylene F, parylene AF-4, parylene HT® and PTFE (polytetrafluoroethylene). A resulting coated nanolaminate film has a moisture permeability less than an equivalent standard leak rate per square inch of 3.0 E-08 atm·cc/in$^2$·sec of air.

18 Claims, 22 Drawing Sheets

(51) Int. Cl.
*H05K 3/40* (2006.01)
*H05K 3/00* (2006.01)
*H05K 3/46* (2006.01)
*H05K 3/30* (2006.01)
*H05K 1/02* (2006.01)

(56) References Cited

U.S. PATENT DOCUMENTS

| | | |
|---|---|---|
| 5,757,126 A | 5/1998 | Harvey, III et al. |
| 8,148,830 B2 | 4/2012 | Bedinger et al. |
| 8,173,906 B2 | 5/2012 | Bedinger et al. |
| 8,319,112 B2 | 11/2012 | Bedinger et al. |
| 2002/0068143 A1 | 6/2002 | Silvernail et al. |
| 2008/0185173 A1 | 8/2008 | Bedinger et al. |
| 2010/0209702 A1 | 8/2010 | Tsai et al. |
| 2013/0045374 A1 | 2/2013 | Yu et al. |

OTHER PUBLICATIONS

International Search Report and Written Opinion of International Application No. PCT/US2020/021443 dated Jul. 20, 2020.

Nanolaminate coated low permeability polymer

Nanolaminate coated conventional polymer

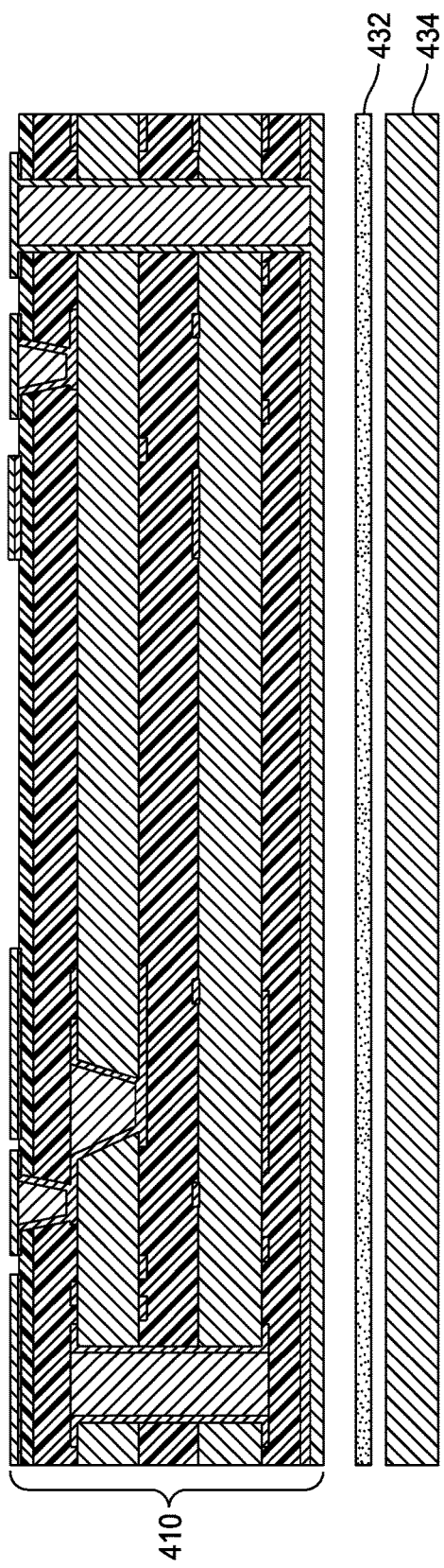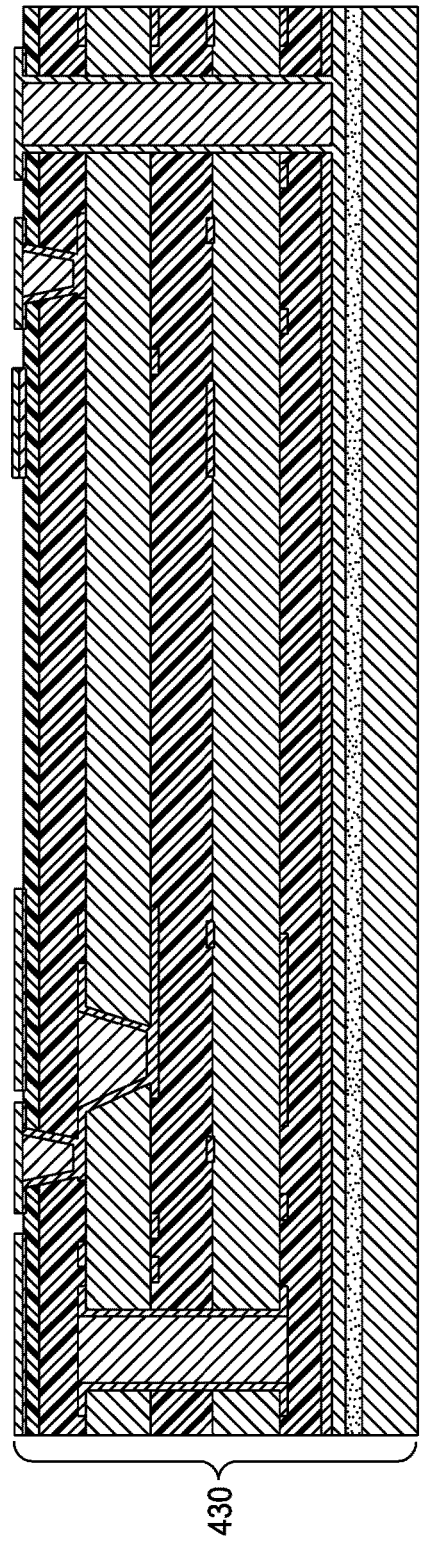
Figure 6C
Figure 6D

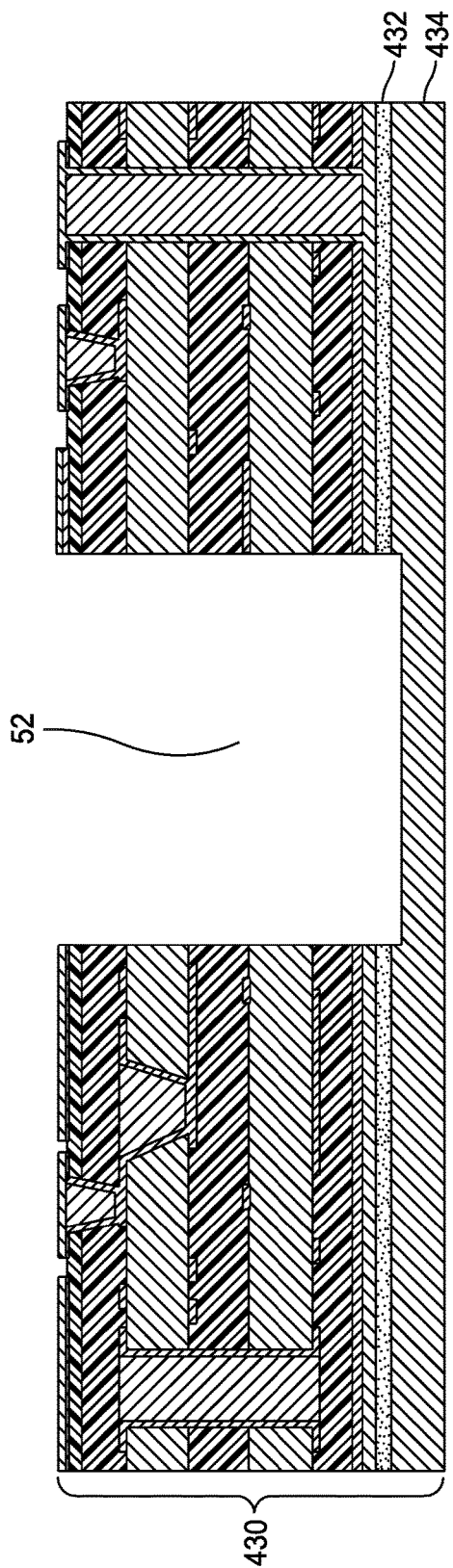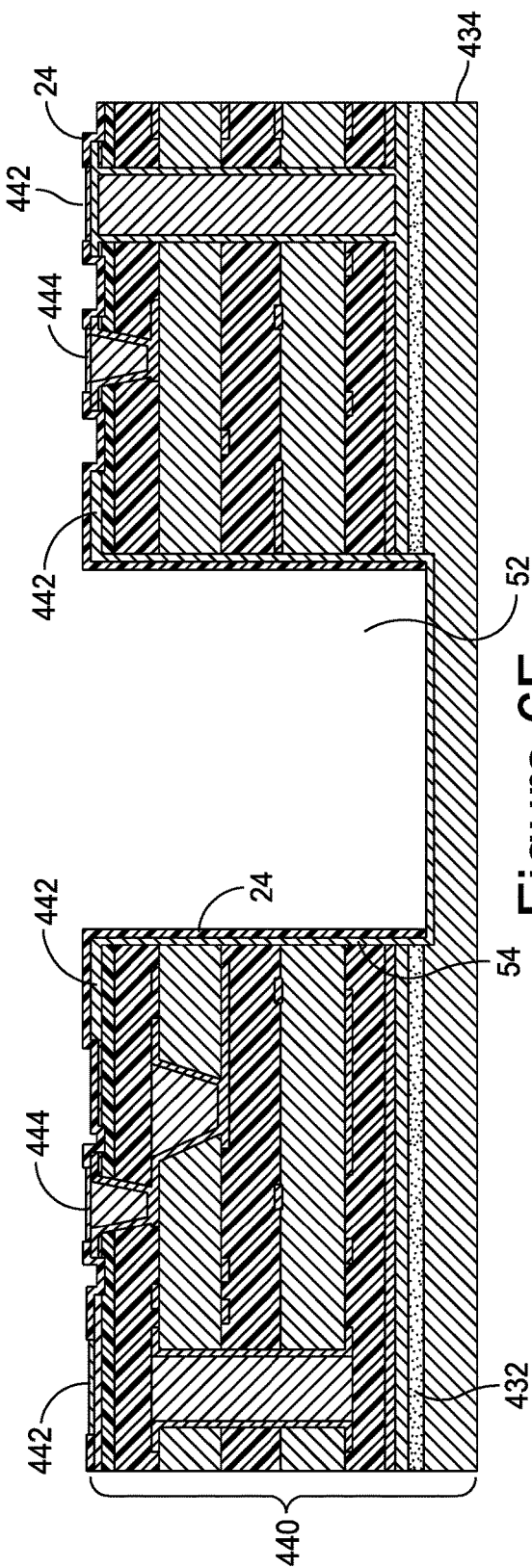

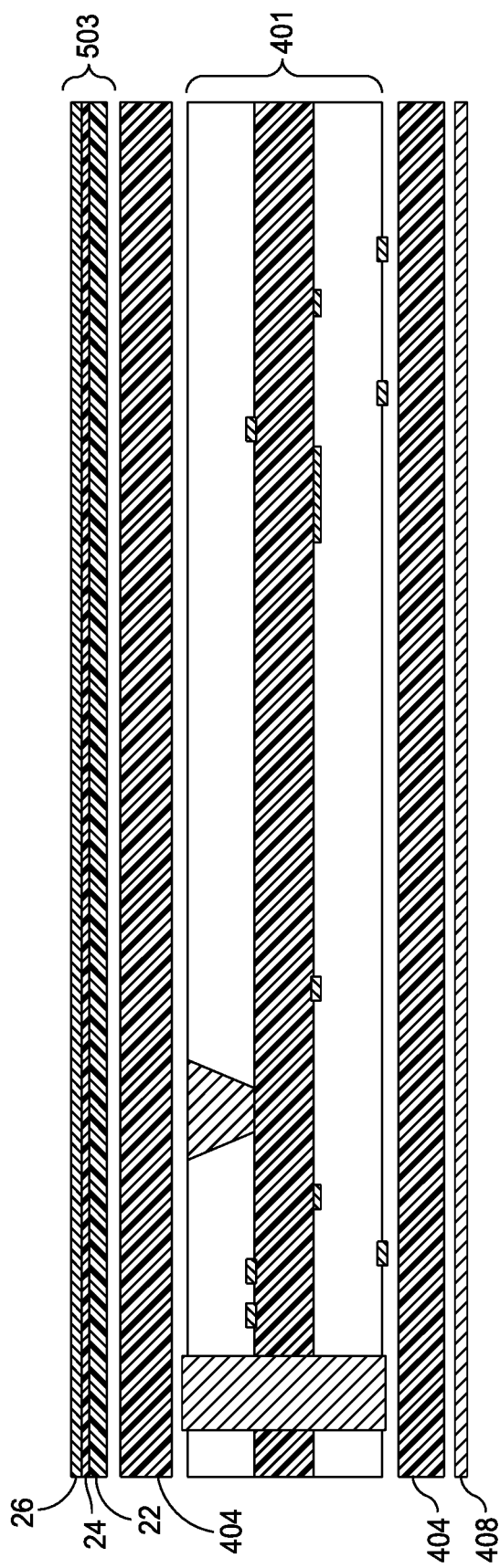
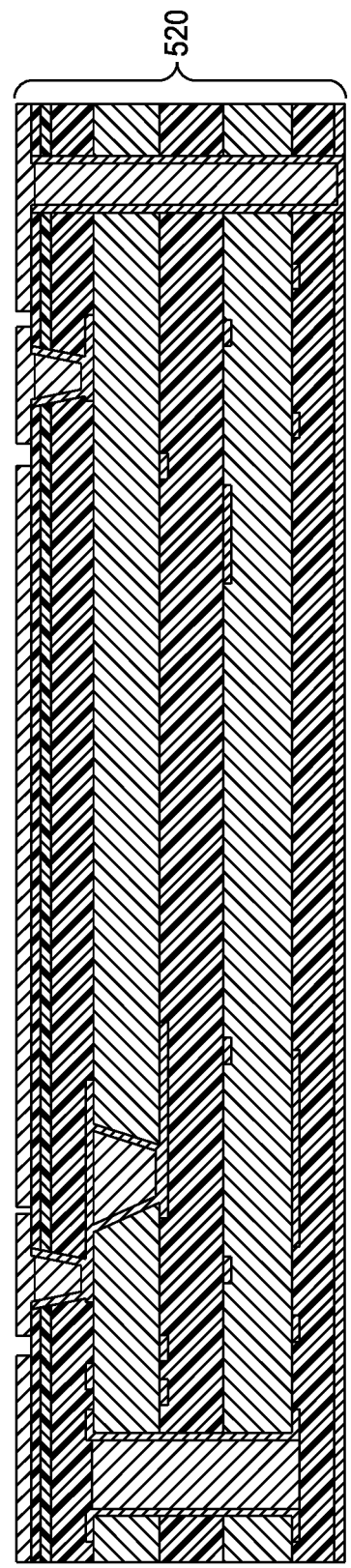
Figure 8A
Figure 8B

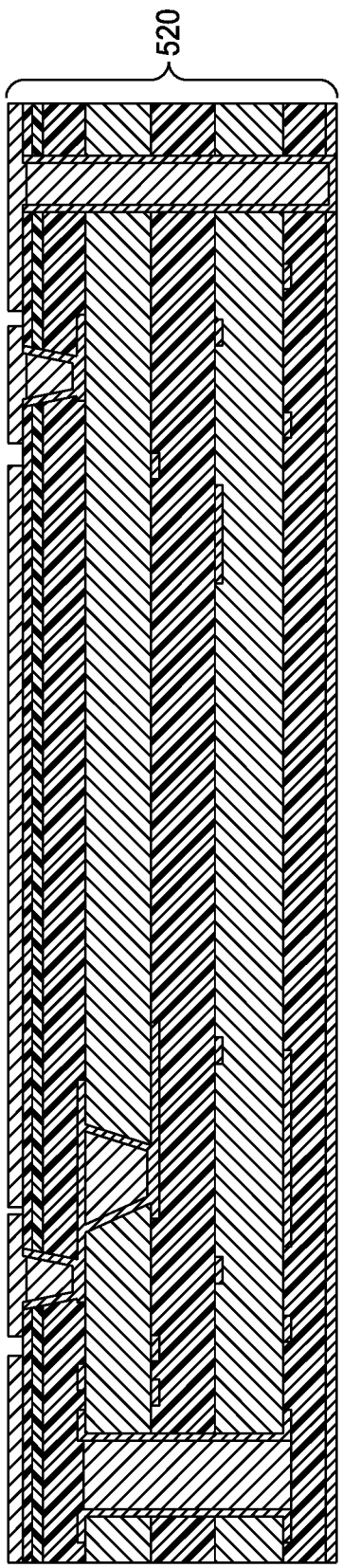
Figure 8C
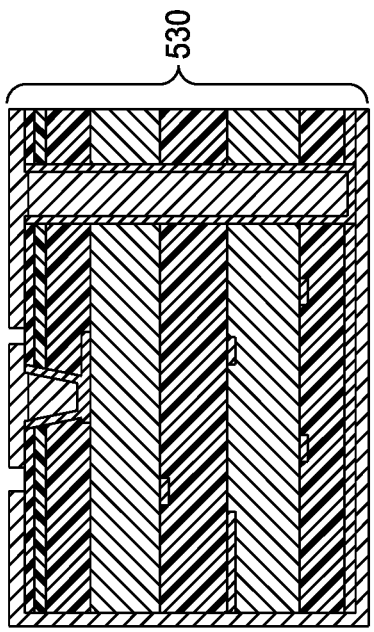
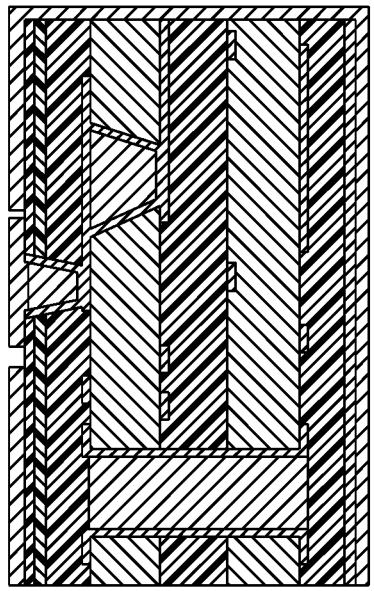
Figure 8D

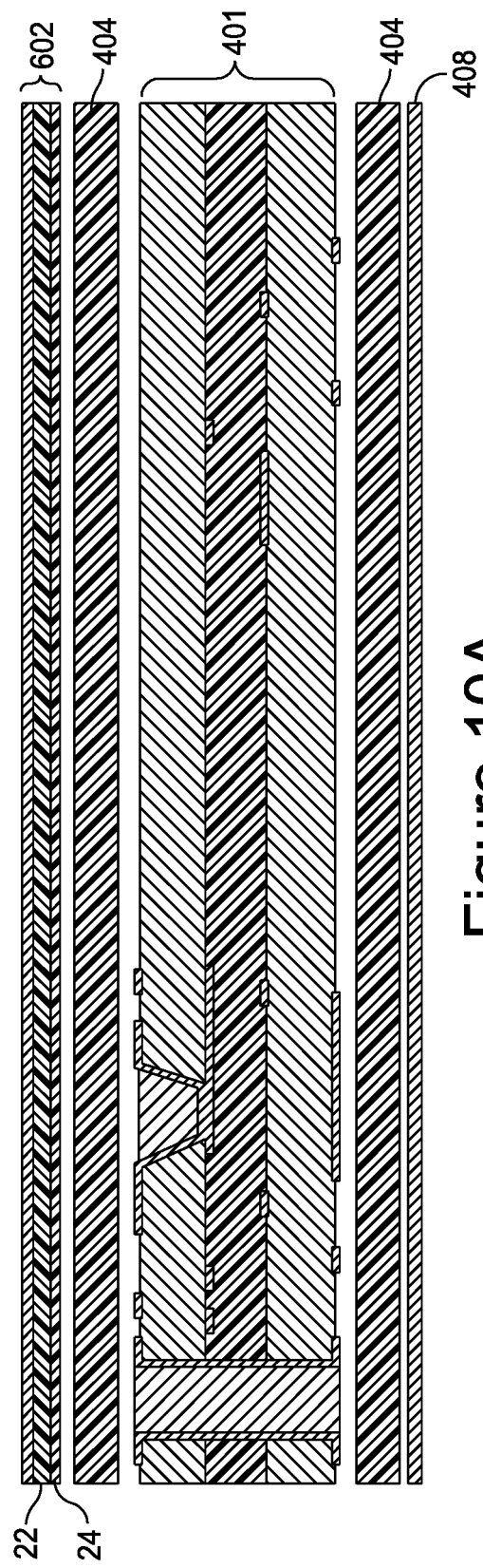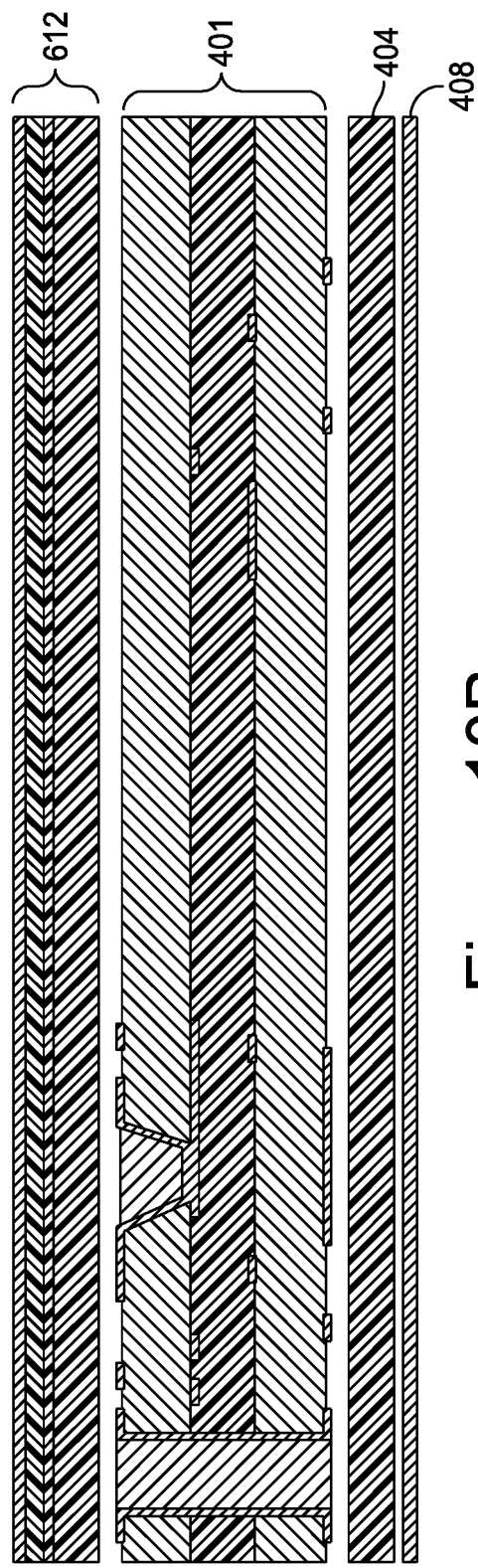

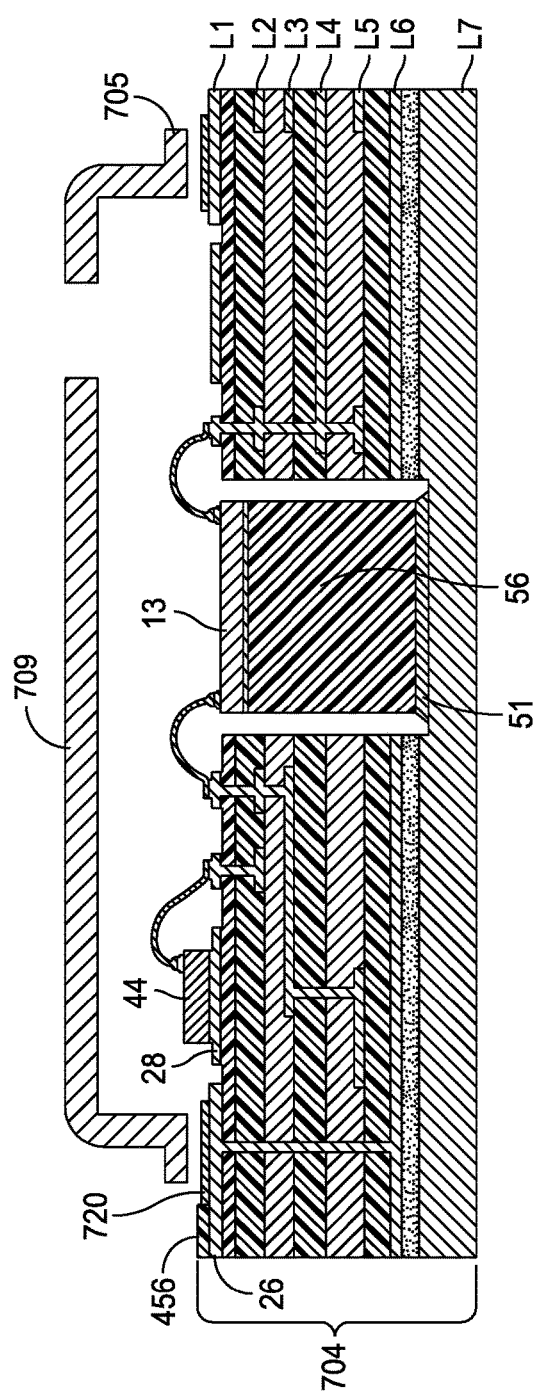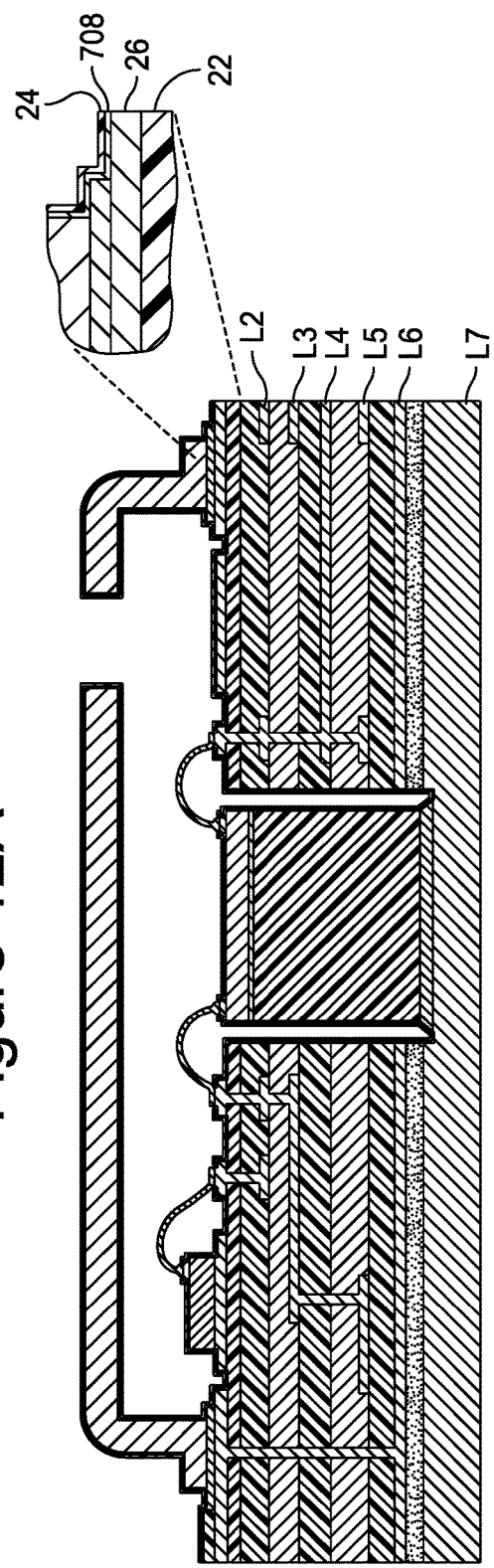
Figure 12A
Figure 12B

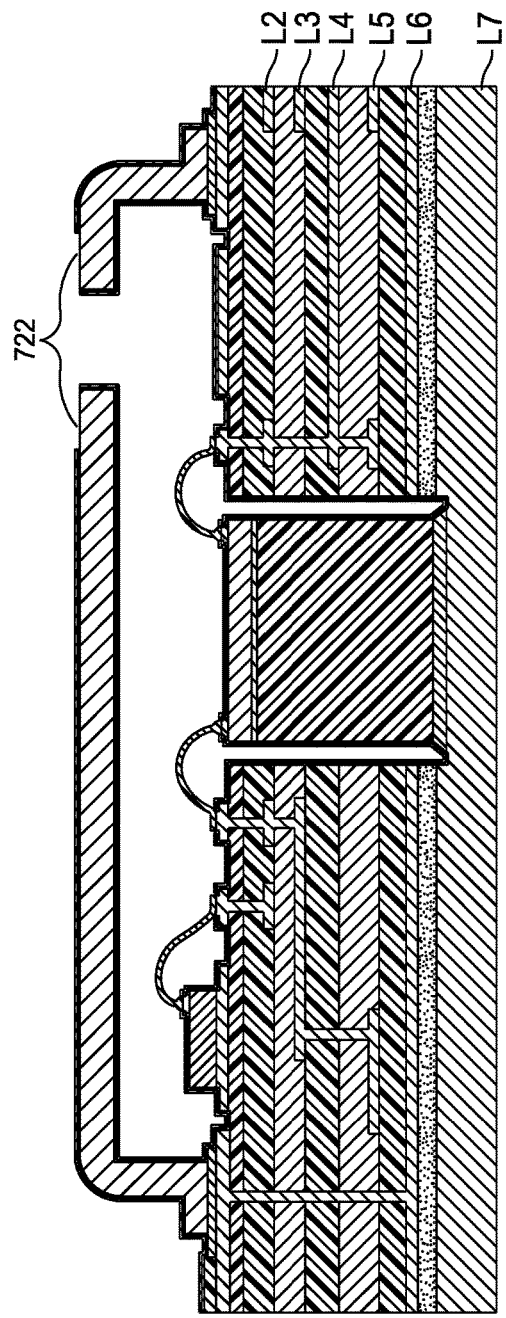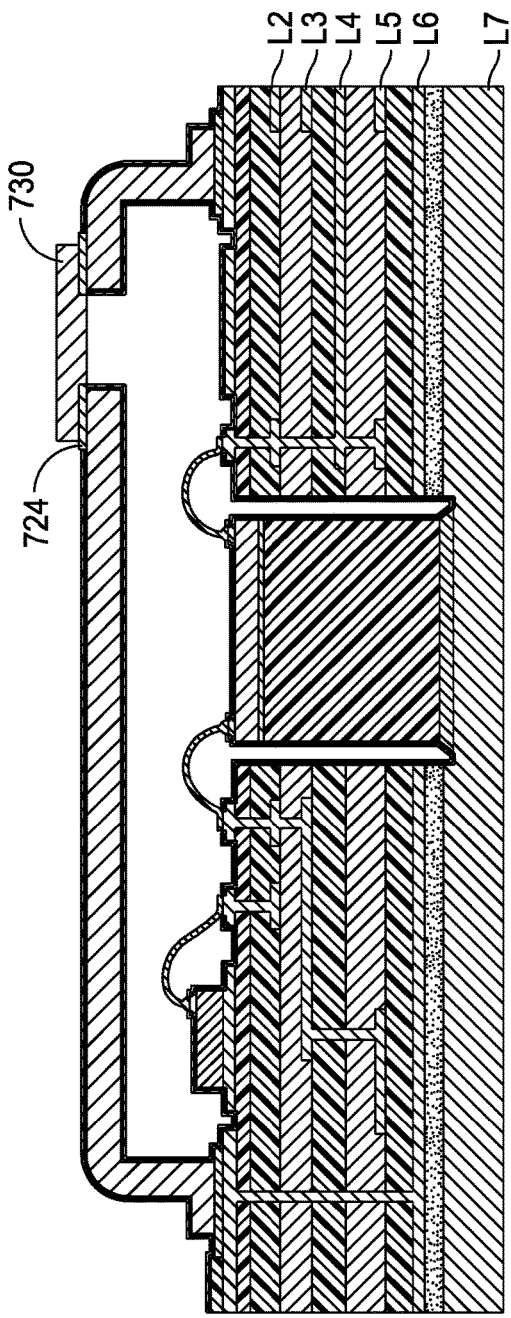
Figure 12C
Figure 12D

HERMETIC CHIP ON BOARD

BACKGROUND OF THE DISCLOSURE

This disclosure relates generally to mounting electronic components onto a substrate or circuit board, and more particularly, to a circuit board construction and an associated environmental protection system and method of manufacturing the same.

Present day microelectronic assemblies utilize printed circuit boards with active and passive components attached to the circuit board in hermetically sealed and/or plastic encapsulated packages. The hermetic or plastic encapsulated packages are required to environmentally protect the active components from moisture and other adverse materials. Such packages are inherently expensive, and require significantly more size, weight and cost than would be required by directly mounting the active components to the circuit board. Additionally, the prepackaged devices increase the electrical loss and thermal impedance of the assembled devices. Plastic encapsulated devices are also inherently more moisture sensitive and can subject the semiconductor devices to dielectric loading effects that degrade device performance and reliability. For flip chip devices, dielectric loading from flip chip underfill or aerogel can be a major source of degraded output power due to increased internode capacitance. Prior attempts to achieve a hermetic board assembly using polymeric based materials do not recognize or embody the design features, construction and material properties of the board laminate and coating required to achieve a hermetic level of environmental protection to military and industrial leak rate standards. A critical property to achieve a hermetic board construction is laminate moisture permeability. Laminate permeability is, in fact, not a property that is provided in data sheets or characterized by circuit board laminate manufacturers or suppliers. While low permeability coatings on conventional circuit boards have been envisioned to offer the potential to seal high moisture permeability boards, the board and laminate construction and circuit board fabrication process and the associated coating construction and coating process to realize requisite hermeticity has not been envisioned. The difficulty in achieving a coated, low permeability circuit board arises from multiples causes including the use of conventional board material construction and properties, the three-dimensional nature of the board's metallized surface and inherent defects in the board's surface and inherent defects in the coating limiting the ability of the coating to achieve the requisite low moisture permeability. Further, the requisite materials and associated property characteristics have not been defined.

SUMMARY OF THE DISCLOSURE

According to one embodiment of the disclosure, a laminate film is described consisting of a low moisture permeability film with a moisture permeability less than 0.23 gm mm/m$^2$ day equivalent to a standard leak rate of 2.6 E-05 atm·cc·mm/in$^2$·sec·air where "atm cc/sec" refers to the standard leak rate, "mm" refers to the thickness in millimeters and "in$^2$" refers to the square inches of polymer film area in the direction of moisture propagation. The low permeability film is homogeneous in that it is free of glass, ceramic or other fillers. The low permeability film may be selected from the group consisting of LCP (liquid crystal polymer), PCTFE (polychlorotrifluoroethylene), PTFE (polytetrafluorethylene), FEP (fluorinated ethylene propylene) and PFA (perfluoro alkoxy alkane). The water vapor transport and associated permeability of these materials is up to three orders of magnitude less than conventional plastics and circuit board materials such as PET, PEN, polyimide and epoxy-based circuit board materials. The low permeability homogeneous polymer film is coated with a nanolaminate including alternate combinations of nanolaminate material that is selected from the group consisting of alumina, titanium dioxide, beryllium oxide, hafnium oxide, zirconium oxide, silicon nitride, tantalum nitride, silica, parylene F, parylene AF-4, parylene HT® and PTFE. The inorganic layers and organic layers in the nanolaminate film result in a further reduction of over three orders of magnitude or greater in the moisture permeability and associated leak rate of the nanolaminate film to 3.0 E-08 atm·cc/in$^2$·sec of air. The low permeability homogeneous polymer layer significantly reduces the composite permeability of the laminate film by effectively sealing and limiting lateral diffusion of permeable gases and liquids through defects in the nanolaminate film. The thickness of the polymer film is selected to be between 0.5 and 10.0 mils in thickness to limit lateral diffusion through the polymer film edges and through defect sites in the nanolaminate coating. Nanolaminate coatings deposited on a low permeability homogeneous polymer layer as thin as a one mil thick LCP film on a one-millimeter thick multilayer epoxy substrate have been repeatedly measured, as part of this disclosure, to have a water vapor transport rate of less than 0.00005 mg/m$^2$ day at 37 degrees Celsius and 100% relative humidity. Under the same temperature and relative humidity conditions, this low water vapor transport rate corresponds to a permeability of less than 5.1 E-09 atm·cc/sec·in$^2$ air where "atm cc/sec" refers to the standard leak rate in atmosphere cubic centimeters per second, and "in$^2$" refers to the square inches of polymer film area both in the direction of moisture propagation. The conditions of 37 degrees Celsius and 100% relative humidity represent the worst humidity aggravated climatic conditions on earth.

Embodiments of the low permeability, nanolaminate coated film comprise inclusion of a copper layer for use in multilayer printed circuit boards and other applications. The nanolaminate layer can be applied before or after the nanolaminate coated, low permeability polymer film is attached to a conventional high permeability multilayer printed circuit board assembly constructed of inorganic fillers and high permeability resins such as epoxy-based resins. Inclusion of the nanolaminate layer within a free standing, metallized low permeability homogeneous polymer film eliminates the need for application of the nanolaminate coating and selective patterning of the nanolaminate film at the board fabricator or circuit board assembly facility. The low permeability free standing nanolaminate film can then be fabricated cost effectively in batch coating systems and in higher class clean room conditions.

Further embodiments employ hermetic electronic, optical or electro-mechanical architectures utilizing the metallized, nanolaminate coated, low permeability homogeneous polymer film laminated to conventional multilayer printed circuit board layers. The thin, low permeability film is mechanically constrained by the relatively thick conventional circuit board composed of epoxy-based, polyimide-based or other laminates filled with glass, ceramic or other filler materials designed to lower the coefficient of expansion of the multilayer circuit board. A hermetic lid assembly is fluxlessly sealed to metallized regions on the circuit board to enclose open faced or lip chip semiconductor or other components. The standard leak rate allowed by Military and Industry Standards for packages greater than 0.4 cc in volume is 1.0 E-6 atm·cc/sec. For packages less than or equal to 0.4 cc in volume and greater than 0.01 cc in volume, the standard allowed leak rate is 1 E-07 atm·cc/sec. Thus, organic or polymer based hermetic packages can be realized over a wide range of sizes using embodiments of this disclosure. Embodiments of this architecture further provide hermetic construction features allowing for the efficient removal of heat from components which dissipate a high amount of power.

The embodiments described provide for a design and method to hermetically seal individual packages or multiple regions on a single or multilayer circuit board assembly in compliance with Military and Industrial Standards. The capability to package multiple regions or channels on a multilayer printed circuit board is applicable to a broad range of applications including Active Electronically Scanned transmit and/or receive Arrays over a broad frequency range from microwave to millimeter wave frequencies.

One aspect of the present disclosure is directed to a low permeability laminate film comprising one or more low moisture permeability homogeneous polymer films with a total thickness between 0.5 and ten mils without glass or ceramic fillers and with a moisture permeability measured at 37° C. and 100% RH of less than 2.6 E-05 atm·cc·mm/in$^2$·sec of air, the polymer film including one of polychlorotrifluoroethylene, polytetrafluoroethylene, fluorinated ethylene propylene, and perfluoro alkoxy alkane. The low permeability laminate film further comprises a nanolaminate including alternate combinations of nanolaminate material that is selected from the group consisting of alumina, titanium dioxide, zirconium oxide, beryllium oxide, hafnium oxide, titanium oxide, silicon nitride, tantalum nitride, silica, parylene F, parylene AF-4, parylene HT® and PTFE (polytetrafluoroethylene). A resulting coated nanolaminate film has a moisture permeability less than an equivalent standard leak rate per square inch of 3.0 E-08 atm·cc/in$^2$·sec of air.

Embodiments of the low permeability laminate film further may include producing a printed circuit board laminate with the low permeability laminate film. The low permeability laminate film may be metallized with copper or other metallization and selectively etched and the nanolaminate coating is placed on top of the patterned copper using atomic layer deposition.

A free-standing printed circuit board laminate may be produced with the low permeability laminate film. The polymer film may be coated with nanolaminate and metallization is deposited on top of the nanolaminate.

A hermetic electronic, optical or electro-mechanical assembly may be produced with the free-standing printed circuit board laminate. The low permeability laminate film may be laminated to a non-homogeneous multilayer circuit board and the resulting construction is comprised of the following elements: a non-homogeneous organic based multilayer substrate such as an epoxy-filled with glass and/or other ceramic based materials with metallization and via interconnections; a metallized and patterned top layer on the low permeability laminate film providing for a hermetic seal ring, metallization regions for one or more components, copper-filled vias for input and output routing of signals from within the hermetic enclosure; a cavity formed by laser and/or mechanically machined through the multilayer circuit, with cavity sidewalls and backside of the multilayer circuit board being metallized with copper; a film or paste adhesive having a laser- or mechanically-removed region in the film or paste adhesive aligning with the cavity cut in the multilayer board; a thermal and/or electrical ground backplane made of copper or other high thermal conductivity materials and joined to the cavity cut and plated multilayer board with the electrically and thermally conductive paste or film adhesive; a deposited low permeability conformal coating with a moisture permeability measured at 37° C. and 100% RH of less than an equivalent leak rate of 2.6 E-05 atm·cc·mm/in$^2$·sec·of air followed by the atomic layer deposited nanolaminate layer and an optional second low permeability conformal coating with the same moisture permeability; one or more components attached and interconnected to the etched metallization regions with the low permeability polymer and nanolaminate layers selectively removed in the regions for component attachment and interconnect and lid sealing; and an impermeable metal, ceramic or glass lid enclosure solder or otherwise hermetically attached to the metallized seal ring.

A method of producing the hermetic electronic, optical or electro-mechanical assembly may include the following steps: laminating the free-standing metallized low permeability laminate with the nanolaminate formed between the metallization and low permeability film to the inner multilayer core; etching through, buried and blind copper-filled vias in the top metallization layer to form the conductive traces and the lid seal metallization region; laser or mechanically drilling and plating cavities; mechanically or laser cutting the backplane film adhesive and pulling back from the cavity region to allow for adhesive flow during backplane lamination; attaching the thermal and/or electrical backplane to the backside of the multilayer structure with electrically conductive past or film adhesive; applying a low permeability sealing layer nanolaminate to the multilayer board structure and selectively etching in regions for component attachment, interconnect and hermetic lid sealing; and attaching and interconnecting one or more components to the etched metallization regions with the nanolaminate selectively removed in the regions for component attachment and interconnection and for hermetic lid sealing.

A hermetic electronic, optical or electro-mechanical assembly may be produced with the free-standing printed circuit board laminate. The free-standing homogeneous, low permeability laminate film may be laminated to a non-homogeneous multilayer circuit board and the resulting construction is comprised of the following elements except with the absence of the deposited and selectively removed polymer conformal coating and atomic layer deposited nanolaminate coating: a non-homogeneous organic based multilayer substrate such as an epoxy-filled with glass and/or other ceramic based materials with metallization and via interconnections; a metallized and patterned top layer on the low permeability laminate film providing for a hermetic seal ring, metallization regions for one or more components, copper-filled vias for input and output routing of signals from within the hermetic enclosure; a cavity laser and/or mechanically cut through the multilayer circuit and the cavity sidewalls and backside of the multilayer circuit board metallized with copper; a low moisture permeability homogeneous polymer film with an equivalent standard leak rate of less than 2.6 E-05 atm·cc·mm/in$^2$·sec. of air with a laser or mechanically removed region in the film adhesive aligning with the cavity cut in the multilayer board a thermal and/or electrical ground backplane made of copper or other high thermal conductivity materials and joined to the cavity cut and plated multilayer board with the low moisture permeability film adhesive; one or more components attached and interconnected to the etched metallization regions with the low permeability polymer and nanolaminate layers selectively removed in the regions for component attachment and interconnect and lid sealing; and an impermeable metal, ceramic or glass lid enclosure solder or otherwise hermetically attached to the metallized seal ring.

A free-standing printed circuit board laminate may be produced with the low permeability laminate film. One side of the polymer film may be coated with copper and the opposite side of the polymer film is coated with nanolaminate.

A hermetic electronic, optical or electro-mechanical assembly may be produced by the free-standing printed circuit board laminate. The low permeability laminate film may be laminated to a non-homogeneous multilayer circuit board and the resulting construction is comprised of the following elements: a non-homogeneous organic based multilayer substrate which may include an epoxy or modified epoxy-filled with glass and/or other ceramic based materials with metallization and via interconnections; a thermal and/or electrical ground backplane or cold plate made of copper or other high thermal conductivity materials and joined to the multilayer board with an electrically and thermally conductive paste or film adhesive; a cavity cut into the multilayer circuit board to the thermal backplane or cold plate with the cavity sidewalls metallized with copper making contact to the copper thermal and electrical backplane; a metallized and patterned top layer on the low permeability laminate film providing for a hermetic seal ring, metallization regions for one or more components, copper-filled vias for input and output routing of signals from within the hermetic enclosure; one or more components attached and interconnected to the etched metallization regions with the nanolaminate selectively removed in the regions for component attachment and interconnection and for hermetic lid sealing; and an impermeable metal, ceramic or glass lid enclosure solder or otherwise hermetically attached to the metallized seal ring.

A free-standing printed circuit laminate may be produced with the low permeability laminate film. The nanolaminate is coated or laminated with a second polymer layer which may be a thermoplastic or thermosetting printed circuit board prepreg layer.

A hermetic electronic, optical or electro-mechanical assembly may be produced with the free-standing printed circuit laminate. The low permeability laminate film may be laminated to a non-homogeneous multilayer circuit board and the resulting construction is comprised of the following elements: a non-homogeneous organic based multilayer substrate such as an epoxy-filled with glass and/or other ceramic based materials with metallization and via interconnections; a metallized and patterned top layer on the low permeability laminate film providing for a hermetic seal ring, metallization regions for one or more components, copper-filled vias for input and output routing of signals from within the hermetic enclosure; a thermal and/or electrical ground backplane or cold plate made of copper or other high thermal conductivity materials and joined to the multilayer board with an electrically and thermally conductive paste or film adhesive; a cavity cut into the multilayer circuit board to the thermal backplane or cold plate with the cavity sidewalls metallized with copper making contact to the copper thermal and electrical backplane; one or more components attached and interconnected to the etched metallization regions with the nanolaminate selectively removed in the regions for component attachment and interconnection and for hermetic lid sealing; and an impermeable metal, ceramic or glass lid enclosure solder or otherwise hermetically attached to the metallized seal ring.

A hermetic electronic, optical or electro-mechanical assembly may be produced with the low permeability laminate film. The low permeability homogeneous laminate film may be laminated to a non-homogenous multilayer circuit board and the resulting construction is comprised of the following elements: an organic based multilayer substrate including an epoxy or modified epoxy-filled with glass and/or other ceramic based materials with metallization and via interconnections; a metallized and patterned top layer on the low permeability laminate film providing for a hermetic seal ring, metallization regions for one or more components, copper-filled vias for input and output routing of signals from within the hermetic enclosure; a nanolaminate coating applied to the etched metallization and selectively removed in regions for component attachment and interconnection and for hermetic lid sealing; one or more components attached and interconnected to the etched metallization regions where the nanolaminate is selectively removed; and an impermeable metal, ceramic or glass lid enclosure solder or otherwise hermetically attached to the metallized seal ring.

A hermetic electronic, optical or electro-mechanical assembly may be produced with the low permeability laminate film. The low permeability laminate film may be laminated to a non-homogeneous multilayer circuit board and the resulting construction is comprised of the following elements: an organic based multilayer substrate constructed in part of non-homogeneous laminate layers including glass and/or mineral-filled epoxy or modified epoxy; a metallized and patterned top layer on the low permeability laminate film providing for a hermetic seal ring, metallization regions for one or more components, copper-filled vias for input and output routing of signals from within the hermetic enclosure; copper-filled thermal vias routed to a copper thermal backplane with the thermal backplane attached with thermally and electrically conductive film or paste adhesive; the nanolaminate coating applied by atomic layer deposition to the etched metallization and selectively removed in regions for component attachment and interconnection and for hermetic lid sealing; one or more components attached and interconnected to the etched metallization regions where the nanolaminate is selectively removed; and an impermeable metal, ceramic or glass lid enclosure solder or otherwise hermetically attached to the metallized seal ring.

A hermetic electronic, optical or electro-mechanical assembly may be produced with the low permeability laminate film. The low permeability laminate film may be laminated to a non-homogeneous multilayer circuit board and the resulting construction is comprised of the following elements: an organic-based multilayer substrate including laminate epoxy-based layers filled with glass and/or ceramic based materials with patterned metallization and via interconnections; a low permeability laminate film; a metallized and patterned top layer on the low permeability laminate film providing for a hermetic seal ring, metallization regions for one or more components, copper-filled vias laser or otherwise drilled for input and output routing of signals from within the hermetic enclosure; copper-filled thermal vias routed to a copper thermal backplane with the thermal backplane attached with thermally and/or electrically conductive film or adhesive; one or more components attached and interconnected to the etched metallization regions where the nanolaminate is selectively removed; and an impermeable metal, ceramic or glass lid enclosure solder or otherwise hermetically attached to the metallized seal ring.

A hermetic electronic, optical or electro-mechanical assembly may be produced with the low permeability laminate film. The low permeability homogeneous laminate film may be laminated to a non-homogeneous multilayer circuit board and the resulting construction is comprised of the following elements: an organic based multilayer substrate including an epoxy-filled with glass and/or other ceramic based materials with metallization and via interconnections; a thermal and/or electrical ground backplane made of copper or other high thermal conductivity materials and joined to the multilayer board with an electrically and thermally conductive paste or film adhesive; a cavity cut into the multilayer circuit board to the thermal backplane with the cavity sidewalls metallized with copper making contact to the copper thermal and electrical backplane; a metallized and patterned top layer on the low permeability laminate film providing for a hermetic seal ring, metallization regions for one or more components, copper-filled vias for input and output routing of signals from within the hermetic enclosure; the nanolaminate coating applied to the etched metallization and sidewall cavity regions selectively removed in regions for component attachment and interconnect on the topside of the board, within the cavity floor and on the lid metallization region; one or more components attached and interconnected to the etched metallization regions with the nanolaminate selectively removed in the regions for component attachment and interconnection and for hermetic lid sealing; and an impermeable metal, ceramic or glass lid enclosure solder or otherwise hermetically attached to the metallized seal ring.

A method of producing hermetic electronic, optical or electro-mechanical assembly may comprise the following steps: laminating the free-standing metallized low permeability homogeneous laminate to the inner multilayer core; etching through, buried and blind copper-filled vias in the top metallization layer to form the conductive traces and the lid seal metallization region; attaching the thermal and/or electrical backplane to the backside of the multilayer structure with electrically conductive past or film adhesive; laser or mechanically drilling cavities through the backplane adhesive and the cavity base and plated sidewalls; applying the low permeability nanolaminate layer to the multilayer board structure and selectively etched in regions for component attachment, interconnect and hermetic lid sealing; attaching one or more components are attached and interconnected to the etched metallization regions with the nanolaminate selectively removed in the regions for component attachment and interconnection and for hermetic lid sealing; and an impermeable metal, ceramic or glass lid enclosure is solder or otherwise hermetically attached to the metallized seal ring.

A hermetic electronic, optical or electro-mechanical assembly may be produced with the low permeability laminate film. The low permeability laminate film may be laminated to a non-homogeneous multilayer circuit board and the resulting construction is comprised of the following elements: an organic based multilayer substrate including an epoxy-filled with glass and/or other ceramic based materials with metallization and via interconnections; a metallized and patterned top layer on the low permeability laminate film providing for a hermetic seal ring, metallization regions for one or more components, copper-filled vias for input and output routing of signals from within the hermetic enclosure; a thermal and/or electrical ground backplane or cold plate made of copper or other high thermal conductivity materials and joined to the multilayer board with an electrically and thermally conductive paste or film adhesive; a cavity laser or mechanically cut into the multilayer circuit board to the thermal backplane without subsequent cavity sidewall metallization; one or more components attached and interconnected to the etched metallization regions and to the thermal backplane; an impermeable metal, ceramic or glass lid enclosure solder or otherwise hermetically attached to the metallized seal ring with an aperture in the lid for through hole coating; a deposited low permeability conformal coating applied through the lid aperture with a moisture permeability measured at 37° C. and 100% RH of less than an equivalent leak rate of 2.6 E-05 atm·cc·mm/in$^2$·sec of air followed by the atomic layer deposited nanolaminate layer and an optional second low permeability conformal coating with the same moisture permeability; and the nanolaminate conformal coating selectively removed around the topside of the aperture and a lid cap solder, welded or otherwise hermetically sealed to the lid region.

A hermetic electronic, optical or electro-mechanical assembly may be produced with the low permeability laminate film. The exposed dielectric surface area within the hermetic enclosure may be reduced to less than 50% through flooding of the dielectric layer with metal.

An active electronically scanned array of hermetic enclosures may be produced with the low permeability laminate film. The enclosures may be spaced in a linear or areal array on a spacing dictated by radar wavelength.

Other technical advantages will be apparent to one of skill in the art.

BRIEF DESCRIPTION OF THE DRAWINGS

Various aspects of at least one embodiment are discussed below with reference to the accompanying figures, which are not intended to be drawn to scale. Where technical features in the figures, detailed description or any claim are followed by references signs, the reference signs have been included for the sole purpose of increasing the intelligibility of the figures, detailed description, and claims. Accordingly, neither the reference signs nor their absence are intended to have any limiting effect on the scope of any claim elements. In the figures, each identical or nearly identical component that is illustrated in various figures is represented by a like numeral. For purposes of clarity, not every component may be labeled in every figure. The figures are provided for the purposes of illustration and explanation and are not intended as a definition of the limits of the invention. In the figures:

FIGS. 6A-6G show cross-sectional views of an abbreviated board fabrication process for producing a hermetic chip on board embodiment of the present disclosure;

FIGS. 8A-8H show an abbreviated board fabrication process for producing a simplified hermetic chip on board construction;

FIGS. 10A and 10B show cross-sectional views of the simplified fabrication process for very high-power hermetic chip on board embodiments;

FIGS. 12A-12D show an abbreviated process flow for the simplified fabrication embodiment with improved reliability;

DETAILED DESCRIPTION OF THE DISCLOSURE

Figure 1B:
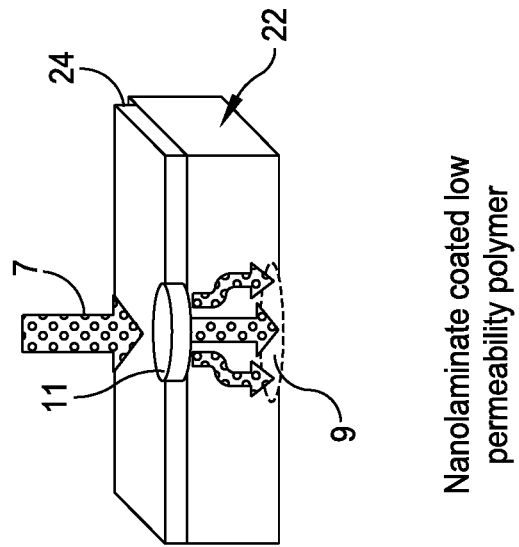
FIGS. 1A and 1B are a schematic illustrations showing the theoretical basis for achieving low permeability polymer film embodiments.
Figure 1A:
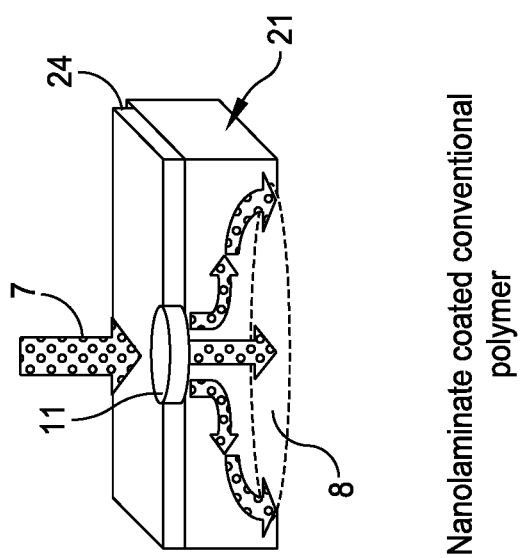

To realize the requisite low permeation rate required for meeting Military and Industry Standards with a hermetic chip on board architecture, a thin low permeability polymer top or cap layer free of glass, ceramic or other fillers is fabricated separately or as part of the multilayer board structure coated with a much lower permeability nanolaminate inorganic layer. The unfilled low permeability polymer cap layer eliminates physical and material discontinuities in the nanolaminate coating induced by glass weave and or particles in the board and separation from the particles and resin matrix which can occur in elevated temperature processing, thermal cycling and humidity exposure and provides a smooth uniform surface for coating. The low permeability of the cap layer significantly reduces the permeability degradation caused by pinholes, surface particles or other defects in the nanolaminate coating of the cap layer. The low permeability polymer film is selected from a group of polymers with moisture permeability up to three orders of magnitude less than conventional circuit board materials including those that are epoxy or polyimide based. The nanolaminate coated low permeability homogeneous polymer film further lowers the permeability by greater than three orders of magnitude. The theoretical basis for the ultra-low permeability achieved is shown in FIGS. 1A and 1B. As shown in FIG. 1A, a nanolaminate coating 24 of conventional polymer laminate materials 21, including epoxy based printed circuit materials, and PEN and PET used for optical displays, results in significant lateral spreading 8 of moisture 7 through pinhole defects 11 in the nanolaminate film effectively increasing the diameter and associated permeability of the nanolaminate coated material. Using a nanolaminate coated 24 low permeability material 22 such as that shown in FIG. 1B results in significantly reduced lateral spreading 9 of moisture 7 through the defect 11 as well as reducing vapor transport directly proportional to the permeability of the homogeneous polymer film. For polymer films not coated with an inorganic nanolaminate, the water vapor transport rate through low solubility and associated high permeability polymers, such as those used in the printed circuit board industry, is directly proportional to the product of the films permeability, cross sectional area and pressure differential across the film and inversely proportional to the thickness of the barrier film at a given temperature. Hence the permeation rate through the low permeability nanolaminate coated film is lowered in direct proportion to the lowered permeability through a defect 11 of fixed dimension and further proportionately lowered by the decreased lateral spreading through the nanolaminate coated 24 low permeability polymer film 22.

Further the thin polymer cap layer will be constrained by the lower coefficient of thermal expansion of the inorganically filled laminate layers beneath the thin polymer cap layer for multilayer printed circuit board applications. Constraining the thin polymer layer provides dimensional stability in-plane (x,y) and minimizes out of plane (z-axis) expansion. Such constraining also minimizes the coefficient of expansion thermal mismatch between the inorganic coating layer and the low permeability cap layer. By using a relatively thin cap layer, the higher coefficient of thermal expansion of the unfilled low permeability cap or top layer is constrained by the lower laminate layers which use conventional epoxy laminate materials filled with epoxy, glass or other low thermal coefficient of expansion materials.

Atomic layer deposition of an inorganic or combination inorganic/organic composition, such as that described in U.S. Pat. No. 8,148,830, can be coated on the low permeability polymer. Atomic layer deposition is uniquely beneficial compared to physical vapor deposition and chemical vapor deposition because of its ultra-low permeability and high conformality. Atomic layer deposition can effectively coat and seal three-dimensional board surfaces such as those resulting from etched copper features on the coated surface of a dielectric board's surface. The incorporation of a low permeability board homogeneous board material in conjunction with an ultra-low moisture permeability coating provides the ultra-low permeability required to meet hermetic leak standards in the presence of coating surface defects which are known to be the major cause of degraded coating permeability.

Circuit boards of this disclosure with low permeability homogeneous sealing layers as thin as one mil and coated with an inorganic atomic layer deposited coating have been independently tested at MOCON laboratories. The MOCON testing has demonstrated water vapor transport rates of less than 0.05 mg/m$^2$ day, the repeatability limit of the Aquatran® Model 3 instrument used for testing. The value of 0.05 mg/m$^2$ day is over two orders of magnitude lower than the permeability of the LCP (Liquid Crystal Polymer) or PCTFE (Polychlorotrifluoroethylene) cap layer even with a one-millimeter thick cap layer and two order of magnitude lower permeability than required to meet military and industry hermetic leak test requirements. Additional margin to leak test requirements can be achieved by flooding the top cap layer with metal to minimize dielectric exposure. Flooding the top layer can reduce exposed dielectric from nominally greater than 50% to less than 50%. The relatively thick copper layers, for example 1.4 mils in thickness, are effectively impervious to moisture and only the exposed dielectric regions allow a low-level moisture permeation. Liquid crystal polymer (LCP) boards capped with a one to two mil LCP layer and coated with ALD of this disclosure have survived solder reflow conditions and extended thermal cycling without degradation of moisture permeability and associated leak rates.

Figure 2:
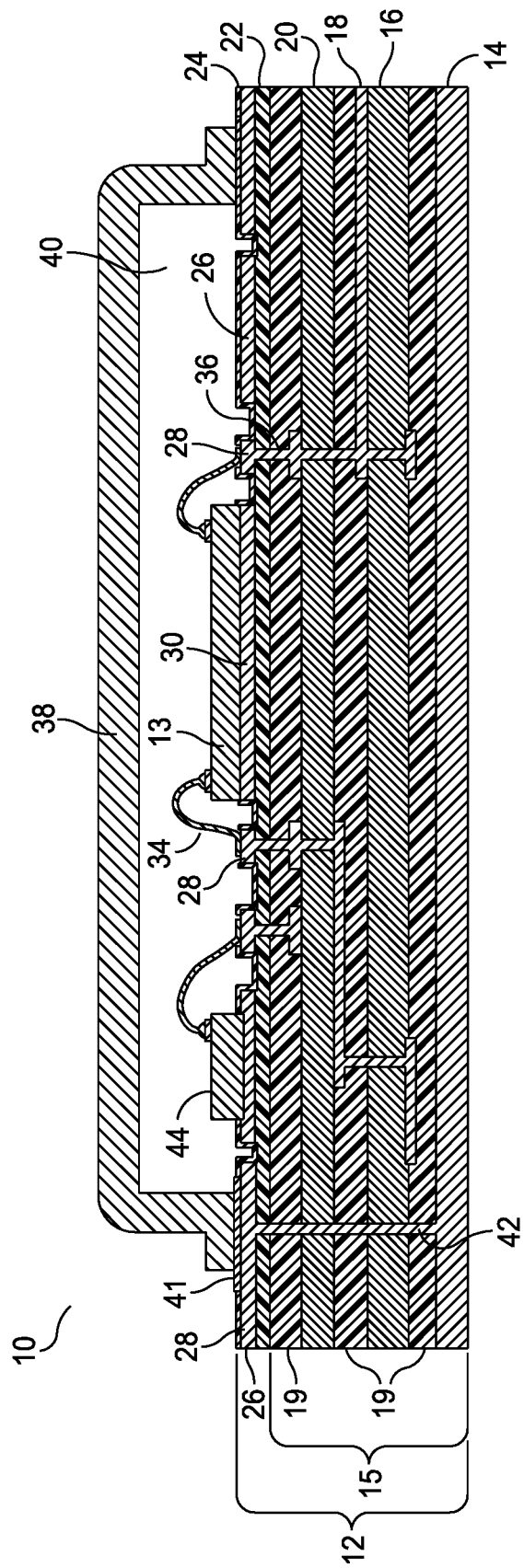
FIG. 2 is a cross-sectional view of a portion of a printed circuit board assembly having an upright hermetic chip on board embodiment.

Referring to the drawings, FIG. 2 shows one embodiment of an electronic assembly, which is constructed according to the teachings of the present disclosure. As shown, the electronic assembly embodies a printed circuit board assembly, generally indicated at 10, which includes a substrate, generally indicated at 12, on which at least one electrical component 13 is mounted. In the shown embodiment, the printed circuit board assembly embodies an upright hermetic chip on board architecture. By hermetic chip on board is meant that unpackaged discrete semiconductor components are directly attached and interconnect to the circuit board. In one embodiment, the substrate 12 is multi-layered, having a ground plane 14, a first dielectric layer 16 disposed above the ground plane, a copper layer 18 disposed above the dielectric layer, and a second dielectric layer 20 disposed over the copper layer. A bonding film 19 known as a prepreg layer may be used to join the dielectric layers together. The number of dielectric layers and copper layers can be varied depending on the particular application of the substrate 12 of the printed circuit board assembly 10.

Although copper is the industry standard when fabricating electronic substrates, it should be understood that aluminum or other metals may also be used. Moreover, the copper layer will typically be finished with a protective layer consisting of a combination of nickel or gold, or nickel, palladium and gold. Silver may also be used for some applications. The protective metal layer also serves as a preferred metallization for wire bonding, solder attachment and subsequent coating(s). The preferred thickness of the topside copper is 1.4 mils to eliminate or minimize the presence of pinholes. The 1.4 mil minimum thickness provides a pore or pinhole free metal layer which is highly impervious to moisture.

The substrate 12 includes a low moisture permeability sealing or cap layer 22, which is integrated into the board design and fabrication process. The cap layer is relatively thin, for example one to four mils, to constrain the coefficient of expansion of the sealing cap layer, minimize board height and minimize transverse water permeation through the cap layer. In this embodiment, the low permeability sealing cap layer may be pre-metallized by the copper clad laminate manufacturer. The material properties and physical design of the sealing layer 22 are selected to meet physical, electrical and chemical properties and to assure moisture permeation rates less than that required by the requisite Military or Industry Standard requirements. For multilayer circuit board applications, the melting point of the polymer cap layer may be greater than 200° C. and the dielectric constant and loss less than 3.0 and 0.004, respectively. The metallized regions of the top layer are effectively hermetic due to the relatively thick copper layer 26 used for signal and ground routing in the top layer. In one embodiment, the sealing layer 22 is designed with minimal exposed dielectric area, e.g., 50% or less, with the material being selected of a homogeneous, non-composite material that assures low moisture board permeability when coated with a described nanolaminate coating, indicated at 24, preferably using atomic layer deposition. Low moisture permeability must be assured even after exposure to solder reflow temperatures, thermal cycling and chemical and environmental exposure in the fielded application. The sealing layer 22 is attached to the metallization region 26 to hermetically attach, for example, a metal domed lid enclosure to assure moisture cannot penetrate into a protected cavity region formed between the domed enclosure and hermetically sealed board and to provide electrical isolation between active circuit regions. The hermetic lid further provides physical protection from handling damage and electrical isolation between multiple regions where active components are attached and interconnected. Copper filled vias 36 are used and plated over pads as in standard printed circuit board construction. The nanolaminate coated, low permeability sealing cap layer and copper filled vias prevent moisture diffusion into the hermetic cavity.

In the shown embodiment of FIG. 2, the printed circuit board includes a plurality of pads, each indicated at 28, including a component mounting pad 30, which are fabricated from the metallization region 26. The substrate 12 including the sealing cap layer 22 can include a metal flooded top layer, e.g., metallization region 26 that minimizes potential dielectric ingression paths. As shown, the metal flooded top layer is etched (or otherwise patterned) to create a number of pads to secure electrical or optical components. For optical components, the lid may include a fused glass to metal sealed window. In the shown embodiment, the mounting pad 30 is configured to receive an electrical component, which may include any component that may be mounted on the mounting pad, for example, a semiconductor device or chip 13. However, other electrical components may also be mounted on the mounting pad 30 and/or the other pads 28, such as transistors, capacitors, resistors, inductors, and the like. As shown, the chip component 13 is wire bonded by wires, each indicated at 34, to the metal pads 28, with one metal pad 28 being associated with via 36. However, it should be understood that components of the printed circuit board assembly 10 can be soldered, wire or ribbon bonded, or epoxy attached as known in the art.

The printed circuit board assembly 10 further includes a low-profile metal lid enclosure 38, which may be solder seal self-aligned or fixture-aligned to create a hermetic seal with the metallized substrate 12 of the printed circuit board assembly. Welding of the lid may also be performed to obtain hermeticity in lieu of solder sealing through utilization of an intermediate seal ring. The intermediate seal ring may be solder attached to the board prior to welding of the lid assembly. The lid enclosure 38 is designed to enclose active devices or other regions of the printed circuit board assembly 10 within cavity 40 that are sensitive to fluids, moisture or other condensed volatile gasses that may dielectric load or corrode components and circuitry. As shown, the domed lid enclosure 38 may include a solder seal in the ablated coating regions provided on pads 28, which is indicated at 41 in FIG. 2.

The relatively thin nanolaminate coatings 24, for example from 10 nanometers to 250 nanometers in thickness described herein may be applied before or after the domed lid enclosure 38 is attached to the substrate 12 of the printed circuit board assembly 10. If the coatings are applied after the domed lid enclosure 38 is attached, a hole or aperture is placed in the domed lid enclosure of sufficient size to allow the coating(s) to uniformly coat the circuitry within the domed lid enclosure using atomic layer deposition and/or CVD polymerization. The conformality of atomic layer deposition and CVD polymerization are key enablers for achieving conformality of the coatings within the domed enclosure. By conformality is meant the uniform coating thickness of all regions within and outside of the cavity. The seal ring aperture is then subsequently ablated to remove the coatings and sealed via soldering or welding. Utilization of solder or welding to attach the domed lid enclosure 38 allows good electrical contact to be achieved from the metal domed lid enclosure to ground vias 42 placed in the printed circuit board assembly beneath the domed lid enclosure, thus improving electrical isolation from other channels or regions on the printed circuit board assembly 10. The domed lid enclosure 38 also provides mechanical protection against handling damage, particulates, fluids, corrosive gases or other contaminants.

After sealing the domed lid enclosure 38, a relatively thick environmental coating may be applied to other regions of the printed board less sensitive to dielectric loading without dielectrically loading the sensitive regions beneath the domed lid enclosure assembly. The relatively thick coating may be a material, such as a conventional circuit board parylene C, silicone, urethane, epoxy or acrylic conformal coatings, an inorganic coating or composite inorganic and organic coatings as subsequently described herein. The nanolaminate coated, low permeability homogeneous cap layer board material and domed lid enclosure 38 allows the circuit board assembly 10 to be subjected to high humidity or condensing environments without moisture or other gaseous condensation and associated dielectrically loading within the enclosure. The inorganic coating will also lower the rate of moisture permeation into the enclosed cavity and eliminate humidity induced damage to the sensitive circuitry.

As shown in FIG. 2, the multilayer circuit board shown and described herein consists of a low moisture permeability, homogeneous sealing layer 22 on top of a conventional circuit board, i.e., substrate 15, selected to meet optimized mechanical and electrical properties. The low permeability homogeneous sealing layer 22 may have a metal foil 26 attached to it before lamination to the circuit board layer 15, i.e., dielectric layer 20 of substrate, beneath the sealing layer such as a Liquid Crystal Polymer Film (LCP). The metallized LCP film can be bonded to the lower level multilayer stack 15 using a pre-impregnated (prepreg) material 46 such as Isola FR408HR or alternately using a free-standing metallized LCP layer with the prepreg bondply attached to the LCP layer. Alternately, the low permeability homogeneous sealing layer 22 may be a PCTFE material such as Rogers 6700 with a lower melt point allowing the metallization layer 26 to be laminated during attachment to the lower level multilayer stack 15. The sealing layer 22 can also be metallized after lamination of the top sealing layer 22 to the multilayer core 15. The top metal layer 26 may be processed to form vias 45 to the layers below using techniques well established in the circuit board fabrication art. After assembly and interconnection of components 13, 44, the circuit assembly 12 may be coated with a nanolaminate layer 24 to substantially reduce the moisture ingress rate through the top layer 22. After application of the nanolaminate layer 24, the lid sealing region and other input/output connection regions may be selectively etched by laser ablation techniques to allow solder sealing 41 of the domed metal lid enclosure 38. The hermetic sealing may be performed using conventional Pb/Sn or alternate solders in a reducing or inert furnace environment free of moisture to provide a moisture free cavity after solder sealing. The solder reflow cycle may be designed to drive off any residual moisture within the cavity prior to the solder reflow portion of the cycle. Alternately, the nanolaminate layer 24 can be applied before assembly and all interconnection and lid sealing regions photolithographically etched or laser ablated to selectively remove the nanolaminate layer 24. After selective ablation of the nanolaminate coating 24 the board may then be assembled and sealed with the techniques described herein. Although a cold plate or metal ground plane 14 is shown throughout several embodiments herein, the cold plate and/or ground plane is not required to achieve the desired level of hermeticity.

In one embodiment, the component 44 can include an integrated dew point sensor or detector in conjunction with an integrated temperature sensor is incorporated in the assembled enclosure to monitor and verify that the hermetic condition is maintained.

In the preferred embodiment shown in FIG. 2, the cap sealing layer 22 is composed of a polymer with a water vapor transport rate at 37° C. and 100% relative humidity of less than 0.23 gm·mm/m$^2$·day equivalent to a moisture permeability less than 2.6 E-05 atm cc·mm/in$^2$·sec·air where "atm cc/sec" refers to the standard leak rate, "mm" refers to the thickness of the polymer cap layer 22 in millimeters and "in$^2$" refers to the polymer film area in square inches both in the direction of moisture propagation. Unfilled polymers of this value have proven successful in meeting hermeticity requires through reduction to practice of this disclosure when used in conjunction with an appropriate nanolaminate coating as described below. A filled polymer meeting the specified water vapor transport rate may be equally successful if it meets the permeability required and is used in conjunction with the nanolaminate coating. Homogeneous unfilled polymers meeting the specified water vapor transport requirement that are available in sheet form include liquid crystal polymer (LCP), perchlorotrifluoroethylene (PCTFE) and FEP (fluorinated ethylene propylene). Other polymers meeting this requirement at room temperature, such as perfluroalkoxy (PFA), are available in powder or granular form and may be extruded to provide material in the required sheet or film format. In the embodiment of FIG. 2, the nanolaminate coating 24 is from the following group of materials selected individually or in combination to form alternating layers of alumina, titanium dioxide, zirconium oxide, beryllium oxide, hafnium oxide, titanium oxide, silicon nitride, tantalum nitride, silica, parylene F, parylene AF-4, parylene HT® and PTFE (in accordance with U.S. Pat. No. 8,148,830).

The nanolaminate layer 24 is selectively removed or masked from the metallization region 26 where electrical or thermal contact is required and where the lid enclosure 38 is solder sealed. The nanolaminate coating is preferably applied with atomic layer deposition to provide conformality and associated uniform nanolaminate coverage over the three-dimensional topography of the etched metallization. The combination of a smooth, homogeneous, low permeability polymer film in conjunction with the described nanolaminate coating applied by atomic layer deposition and optionally CVD polymerization provides over a three order of magnitude reduction in water vapor transport rate of 0.05 mg/m$^2$ day measured at 37° C. and 100% relative humidity. The water vapor transport rate of 0.05 mg/m$^2$ day corresponds to a permeability of the nanolaminate coated unfilled low permeability polymer film equivalent to a standard leak rate per of 3.0 E-08 atm·cc/in$^2$·sec of air where "in$^2$" refers to the exposed dielectric area in square inches in the direction of moisture transmission and "atm·cc/sec" refers to the standard leak rate.

Figure 3:
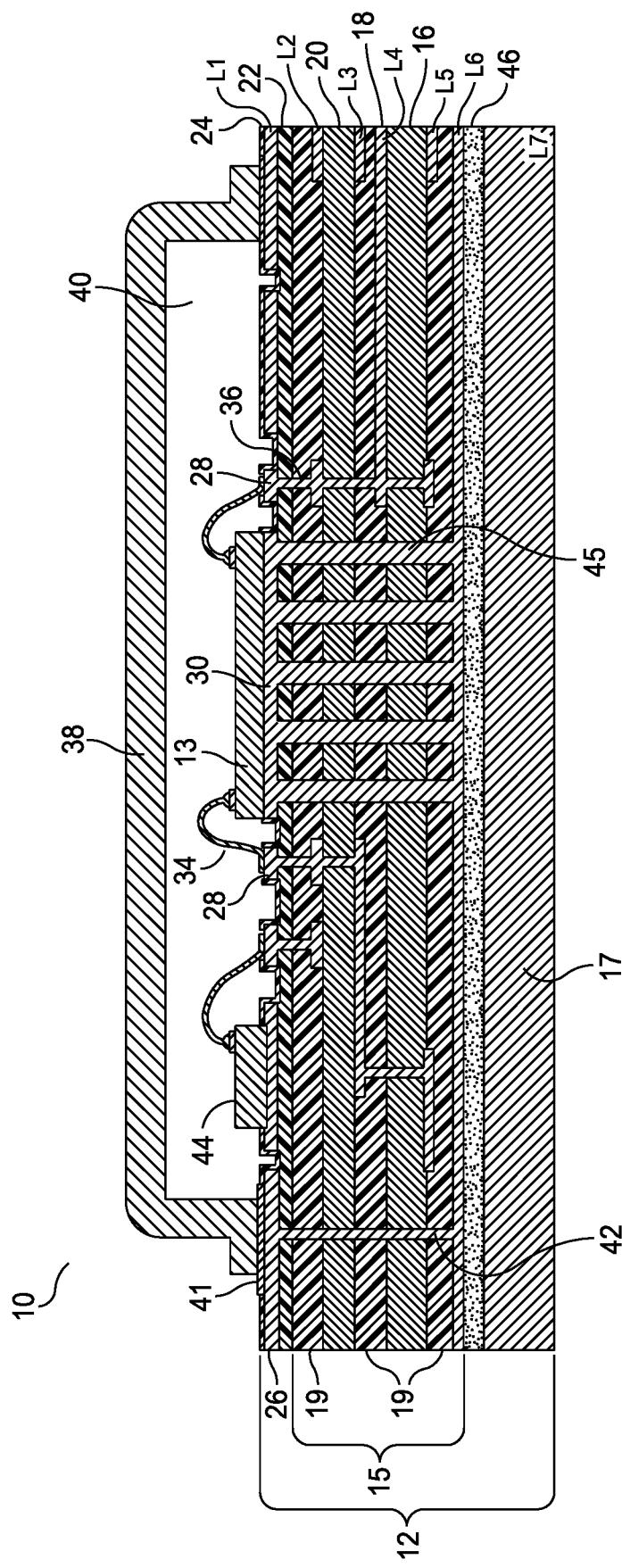
FIG. 3 is a cross-sectional view of a portion of a printed circuit board assembly having an upright hermetic chip on board architecture of another embodiment of the present disclosure offering improved thermal performance.

FIG. 3 illustrates an embodiment for management of higher power devices. The heat from the device 13 is transferred in FIG. 3 through the copper filled vias 44 to the cold plate 17 having thick copper. The thick, for example 20 mil, copper plate 17 may be laminated on the backside of the multilayer substrate 15. For lamination, an electrically and/or thermally conductive paste or film adhesive 46 (prepreg material) may be used to attach the multilayer core circuit board 15 to the copper plate 14. The thick copper plate 17 may act as a liquid or as an air cooled "cold plate" to remove the dissipated heat from the components.

Figure 4:
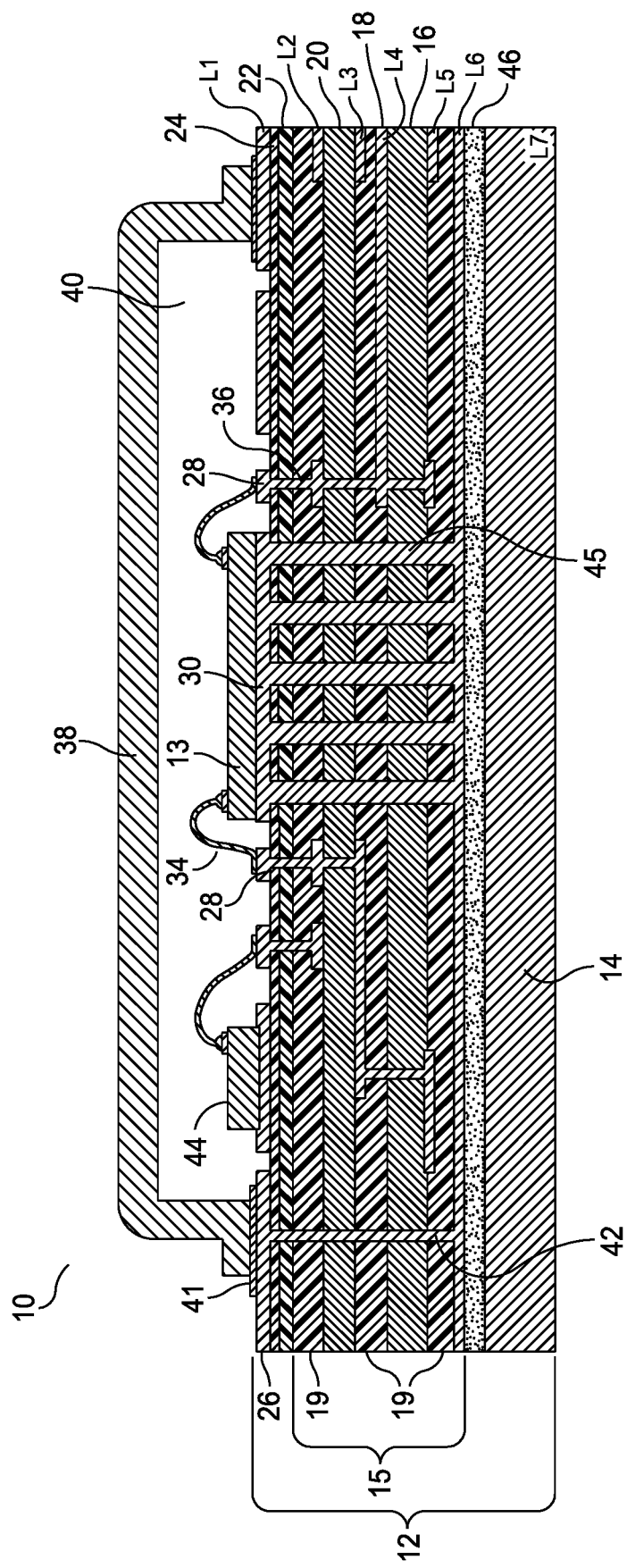
FIG. 4 is a cross-sectional view of a portion of a printed circuit board assembly having an upright hermetic chip on board architecture of yet another embodiment of the present disclosure.

Referring to the embodiment shown in FIG. 4, the nanolaminate coating may be applied to the low permeability homogeneous polymer sealing layer prior to metallization of the polymer sealing layer thus protecting the nanolaminate layer from damage during board fabrication and assembly and eliminating the need for selective laser ablation or patterning of the nanolaminate layer. Further the need for 3D conformality of the nanolaminate coating 24 is substantially minimized and the coating defect density associated with metallization edge discontinuities between the dielectric film and etched copper sidewalls substantially reduced. The nanolaminate coating 24 may be applied to the sealing layer 22 followed by vacuum deposition or electroless and electrolytic metallization of copper layer 26 and the nanolaminate layer 24 before or after laminating the nanolaminate coated low permeability film 22 to the epoxy or other high permeability multilayer core 15. The metallization layer 26 can then be patterned by conventional techniques and vias laser or mechanically drilled by conventional circuit board fabrication techniques. If fabricated prior to attachment to the multilayer core 15, the nanolaminate coated 24, low permeability homogeneous sealing layer 22 can be produced using low cost reel-to-reel coating processes or in large flat panel sheets.

Figure 5:
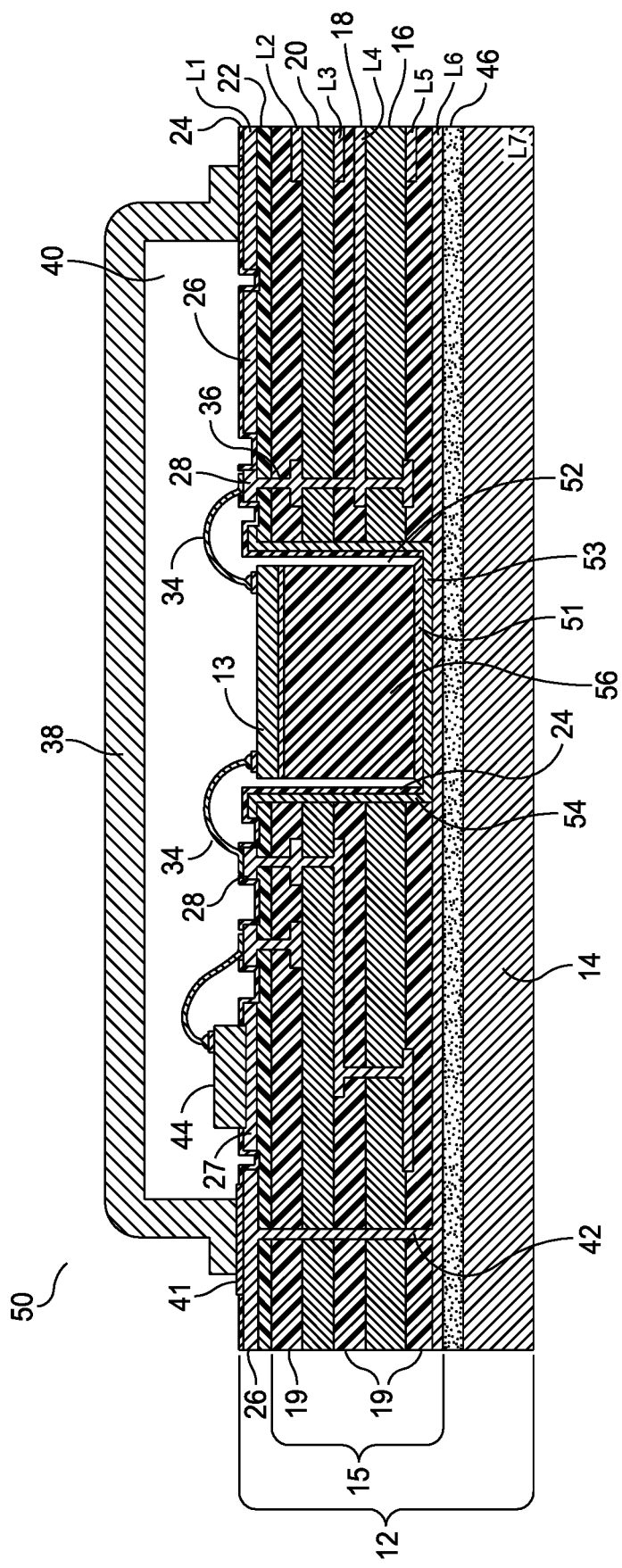
FIG. 5 is a cross-sectional view of a portion of a printed circuit board assembly having an upright hermetic chip on board architecture for efficient thermal dissipation of very high-power devices of yet another embodiment.

Referring to FIG. 5, an embodiment is shown utilizing a printed circuit board assembly and associated upright chip on board architecture for optimal thermal performance generally indicated at 50. The construction of the printed circuit board assembly 50 is similar to the construction of printed circuit board assembly 10 of FIG. 4 with the exception of features that provide for the optimal thermal performance and associated cavity hermeticity. As shown, the printed circuit board assembly 50 includes the substrate 12 having the thick copper cold plate 14, with the first dielectric layer 16 disposed above the ground plane layer, the copper layer 18 disposed above the dielectric layer, and the second dielectric layer 20 disposed over the copper layer. Layers 19 and 16 are prepreg materials used to bond the metallization patterned dielectric layers 16 and 18 together and also to bond the ground plane layer L6 to the multilayer stack 15. As with the substrate 12 of the printed circuit board assembly 10 of FIG. 1, the number of dielectric layers and copper layers can be varied depending on the particular application of the printed circuit board assembly 50.

The substrate 12 of FIG. 5 includes the low permeability sealing layer 22, which as described above with reference to the printed circuit board assembly 10 of FIG. 2, is also integrated into the board design. In one embodiment, the low permeability homogeneous polymer sealing layer 22 is designed with minimal exposed dielectric area by routing interconnections to buried layers and flooding the top dielectric area within the domed metal enclosure region with metal 26. As shown, the substrate 12 of the printed circuit board assembly 50 includes a pocket 52 that extends through all dielectric and metal layers to the thick copper cold plate 14. The cold plate 14 may also be fabricated from aluminum or composite materials using diamond, graphite or other fillers that further improve thermal conductivity, reduce weight and provide a matched thermal coefficient of expansion to the circuit board 15. The pocket 52 includes copper plated pocket sidewalls 54 that extend to the thermal and electrical ground plane 14. The nanolaminate coating 24 is disposed on the etched topside circuit metallization 28, the pocket sidewalls 54 and pocket floor 53 and selectively removed from the regions where components 44 and 13 on thermal spreader pedestal 56 are attached and interconnected. The high thermal conductivity spreader pedestal 56 may be mounted on the ground cold plate 14 within the pocket 52 using thermally and electrically conductive adhesive, solder or sintered silver 51. The thermal spreader pedestal 56 is configured to support the chip 13 mounted on the upper surface of the pedestal. As shown, the chip 13 is wire bonded by wires 34 to metal pads 28.

The substrate 12 including the low permeability sealing layer 22 can include the metal flooded top layer 26 that minimizes exposed dielectric ingression paths. For multi-channel AESA applications or for closely spaced individually hermetically sealed enclosure regions 40, the entire top layer may be metallized except for regions within the hermetic enclosure 40 to eliminate dielectric entry paths adjacent to the hermetic enclosure interior. In the shown embodiment, one of the metallized pads 27 is configured to receive the electrical component 44, which may include any component that is attached to the mounting pad 27 for example, integrated circuits, transistors, capacitors, resistors, inductors, and the like.

As with printed circuit board assembly 10 of FIG. 4, the printed circuit board assembly 50 further includes the lid enclosure 38, which may be solder self-aligned to create a hermetic seal with the substrate 12 of the printed circuit board assembly. The domed lid enclosure 38 is designed to enclose active devices or other regions of the printed circuit board assembly 50 that are sensitive to dielectric loading. As shown, the domed lid enclosure 38 may employ fluxless solder sealing configurations 41 to create a seal between the domed lid enclosure 38 and the substrate 12.

Figure 6A:
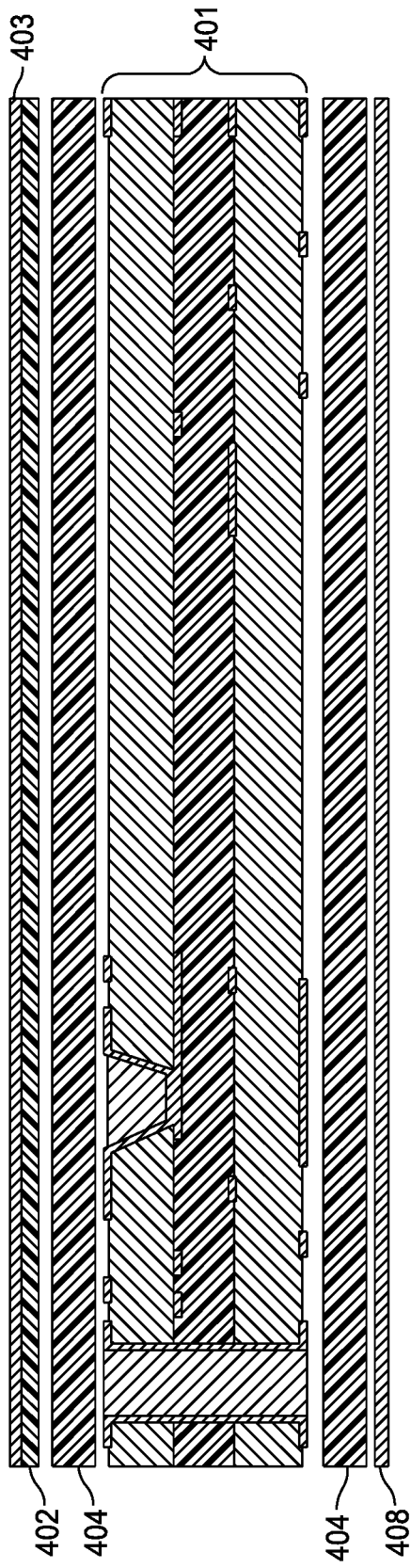
Figure 6B:
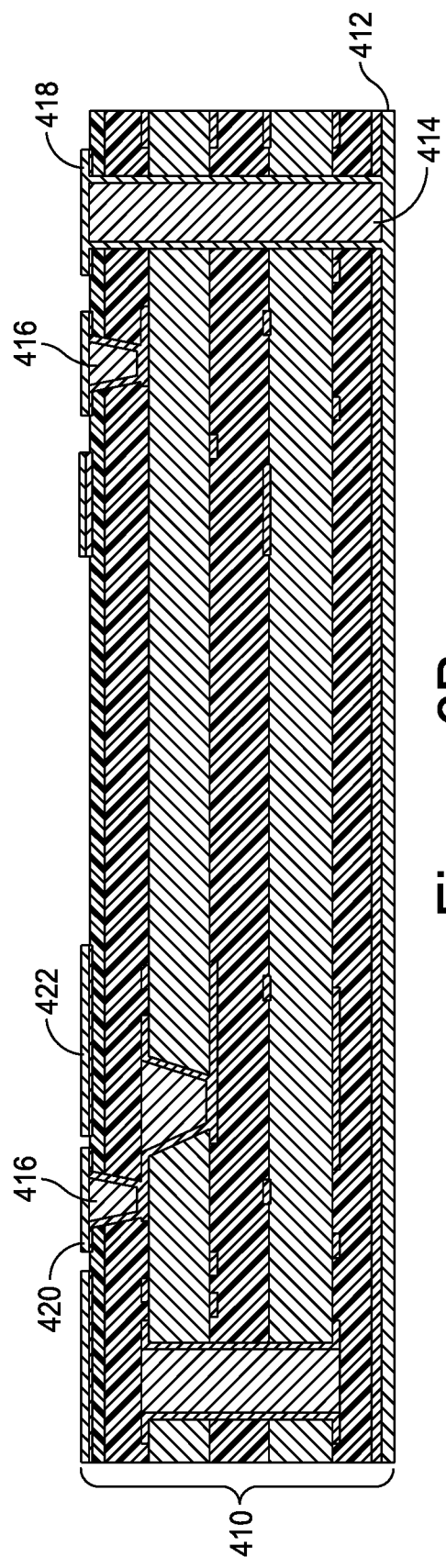
Figure 6G:
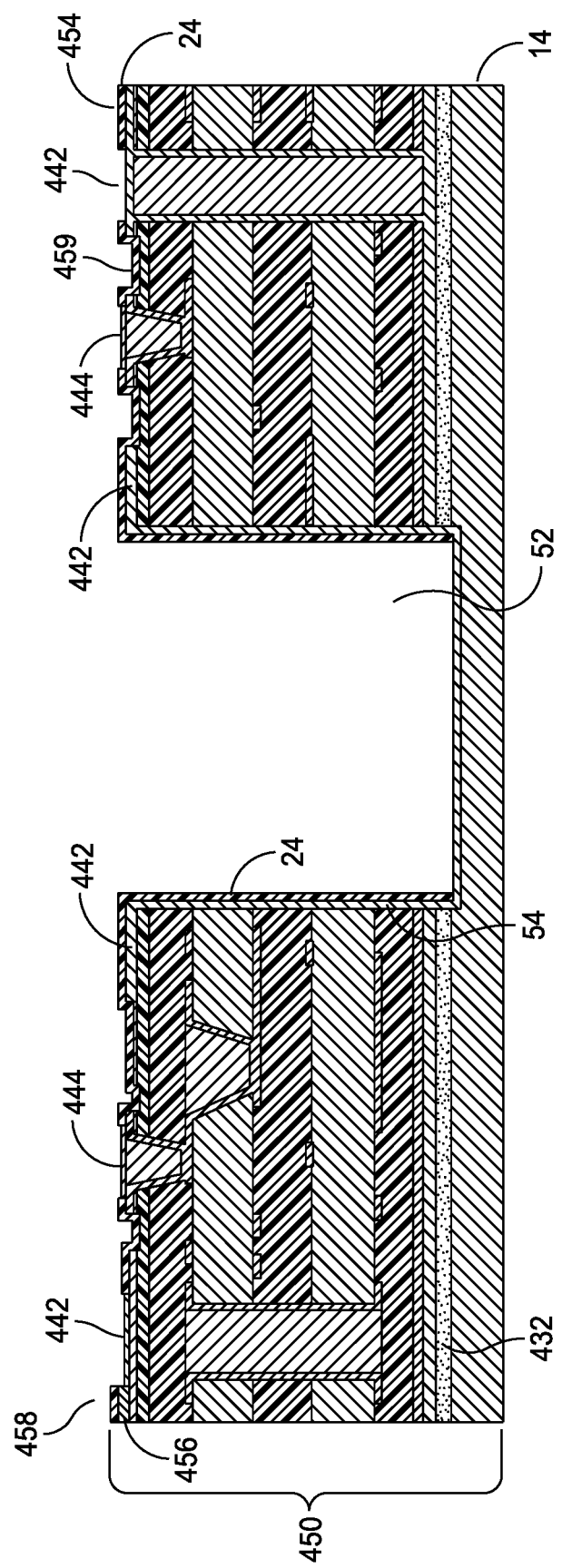

FIGS. 6A through 6G show an abbreviated fabrication sequence for the embodiment shown in FIG. 5. As shown in FIG. 6A, the metallized 403 low permeability homogeneous polymer cap layer 402, prepreg layers 404 and metal layer 408 and prelaminated inner core 401 are pre-aligned for lamination to the multilayer core layer 401. After lamination as shown in FIG. 6B, through vias 414 and blind vias 416 are drilled, metallized and plated shut with copper. Metallization can be achieved by button plating followed by planarization and via pad plating 420 and 418. The bottom side of the multilayer circuit board assembly is also mechanically planarized after button plating and the entire bottom side of the board plated with an additional layer of copper 412 for to increase thermal spreading and associated power dissipation. The topside metal layer 403 is etched to form via pad connections 420 and metallization trace regions 422 resulting in the multilayer circuit board 410. As shown in FIG. 6C, the copper ground and cold plate 434 is aligned with an electrically and thermally conductive film adhesive 432 and laminated together as shown in FIG. 6D to form the multilayer circuit board 430. After lamination, the cavity pocket 52 is mechanically or laser machined in the multilayer circuit board assembly 430 as shown in FIG. 6E through the conductive film adhesive 432 to the cold plate 434. Following cavity formation, the cavity sidewalls 54 are electroless and electrolytically plated to a preferred thickness of 1.4 mils with the sidewall plating wrapping around to form the increased topside pad thickness 442. Following sidewall metallization, the nanolaminate coating 24 is applied and selectively removed by laser ablation or other methods to expose lid sealing metallization 442 and interconnection metallization 444 as shown in FIG. 6F. The sidewall plating is wrapped around the cavity edge to the topside metal 442 to assure the sidewall dielectric region is hermetically sealed with metal and to assure mechanical integrity of the plated sidewalls. The completed fabricated multilayer cavity structure is shown as 440 in FIG. 6F. The lid sealing regions 454 and 458 outside of the hermetic cavity seal ring 442 shown in FIG. 6G may be defined by the patterned nanolaminate coating 24 in region 454 or a nanolaminate coated solder mask 456 as opposed to etched metal and associated open dielectric defined regions 459 within and adjacent to the lid seal region of the cavity. The optional masking features and completed cavity multilayer circuit board assembly is shown as 450 in FIG. 6G. Open dielectric regions within the cavity are preferred to solder mask within the cavity to avoid nanolaminate coating over the solder masked dielectric regions. The solder mask is typically an epoxy with loaded inorganic filler which does not provide for the requisite smooth, low permeability homogeneous sealing layer. Nanolaminate patterned metal 454 or nanolaminate patterned solder mask over metal 458 is preferred adjacent to the exterior of a seal region 442 to avoid a short permeation path from the topside etched metal region to the package interior.

Figure 7:
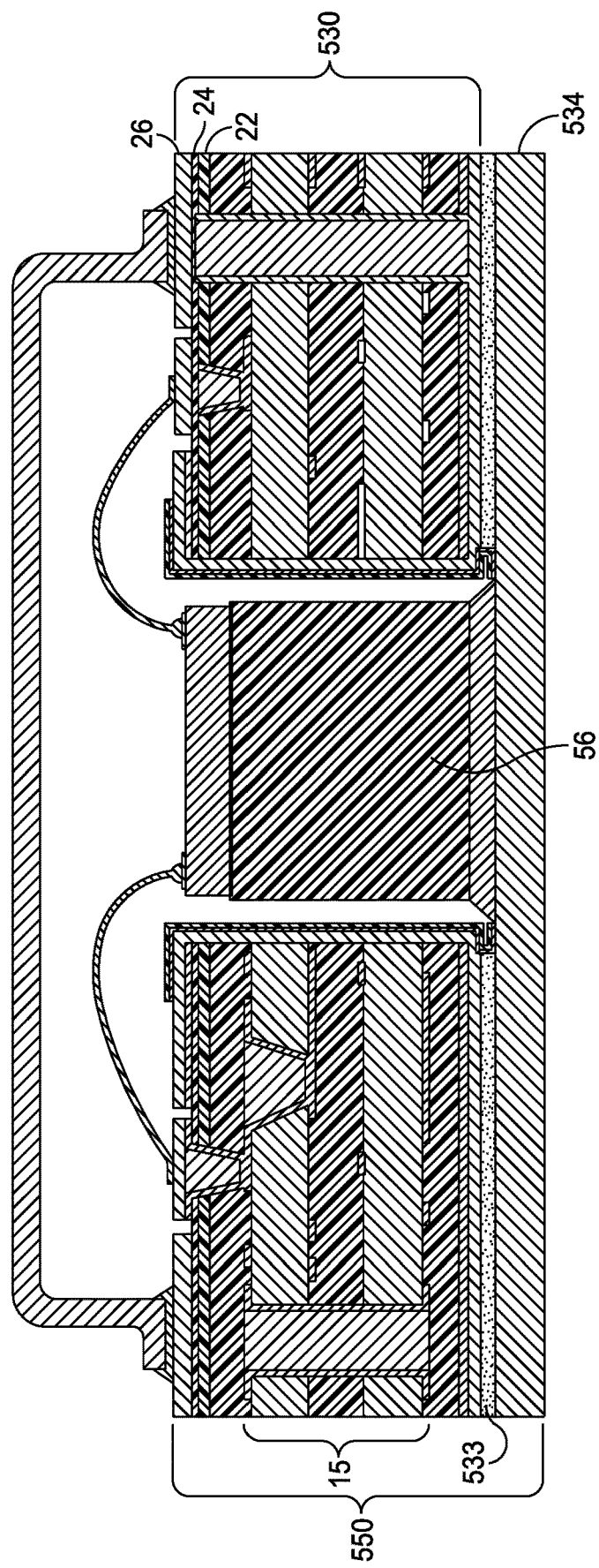
FIG. 7 is a cross-sectional view of another embodiment of the present invention showing a simplified construction method of the hermetic chip on board assembly.

FIG. 7 illustrates an embodiment of the configuration shown in FIG. 5 with the exception that the metallization 26 is applied to the nanolaminate coated 24 low permeability polymer film 22. As described previously, the resulting low permeability nanolaminate and metal coated film can be prepared cost effectively using sheet or reel to reel processing at a centralized facility prior to lamination in a multilayer stack 550 or alternately by sequential build-up of the layers on the core multilayer circuit board 15. The benefit of this embodiment is that no nanolaminate deposition equipment or selective laser coating removal is required at the circuit board fabrication or assembly facility. Further, the separately fabricated nanolaminate film is substantially protected from damage by the metallized coating during board fabrication and assembly.

Figure 8E:
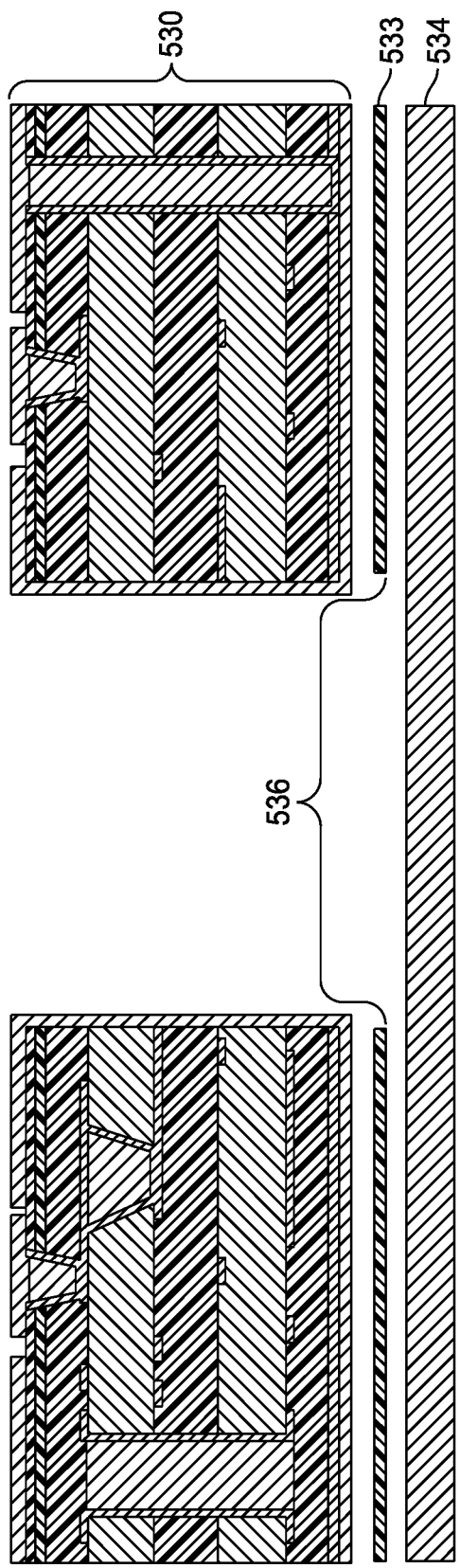
Figure 8F:
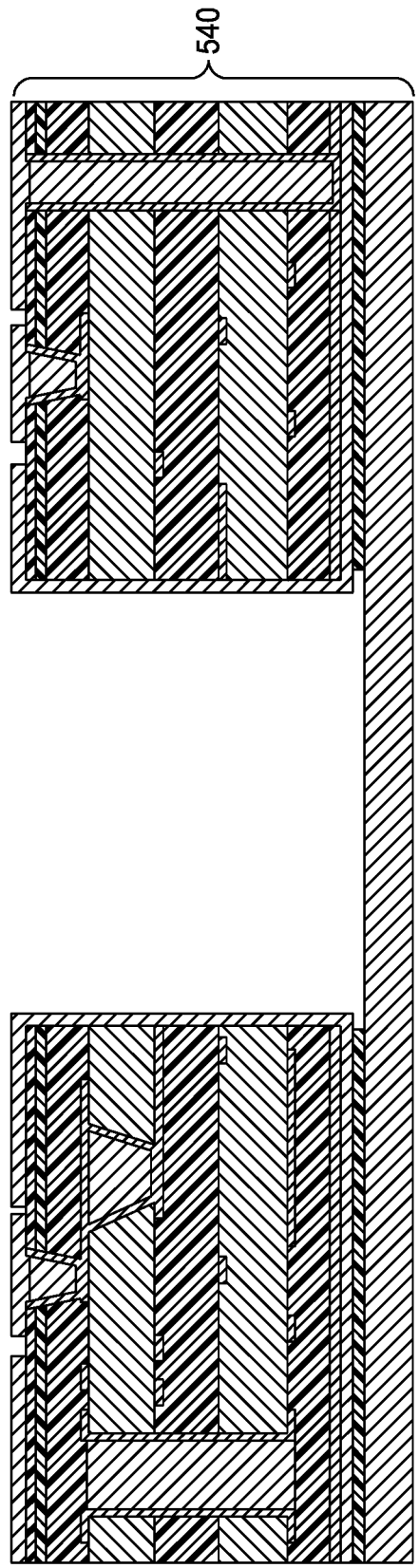
Figure 8G:
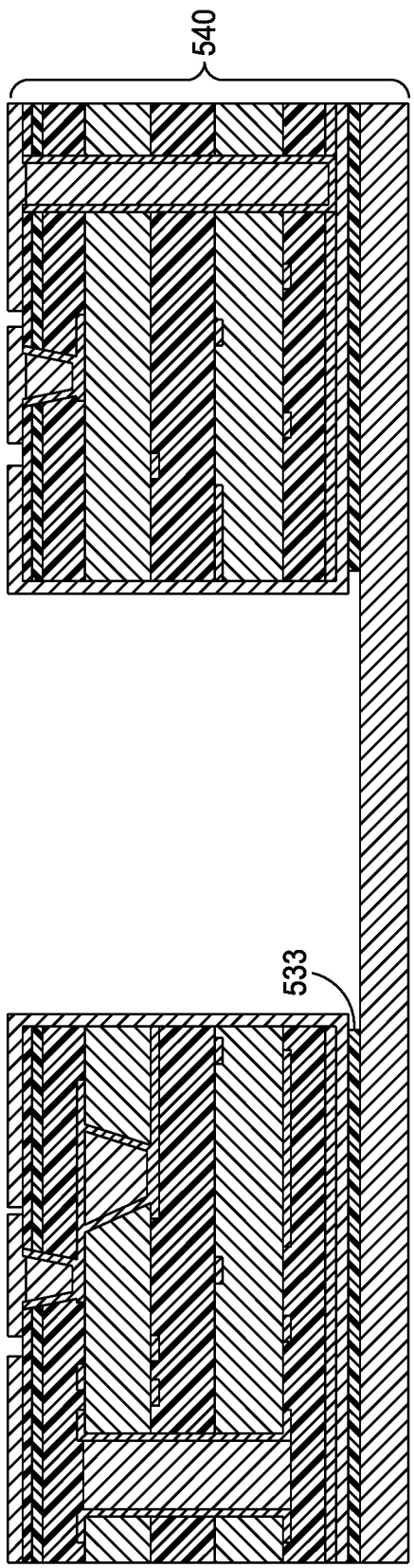
Figure 8H:
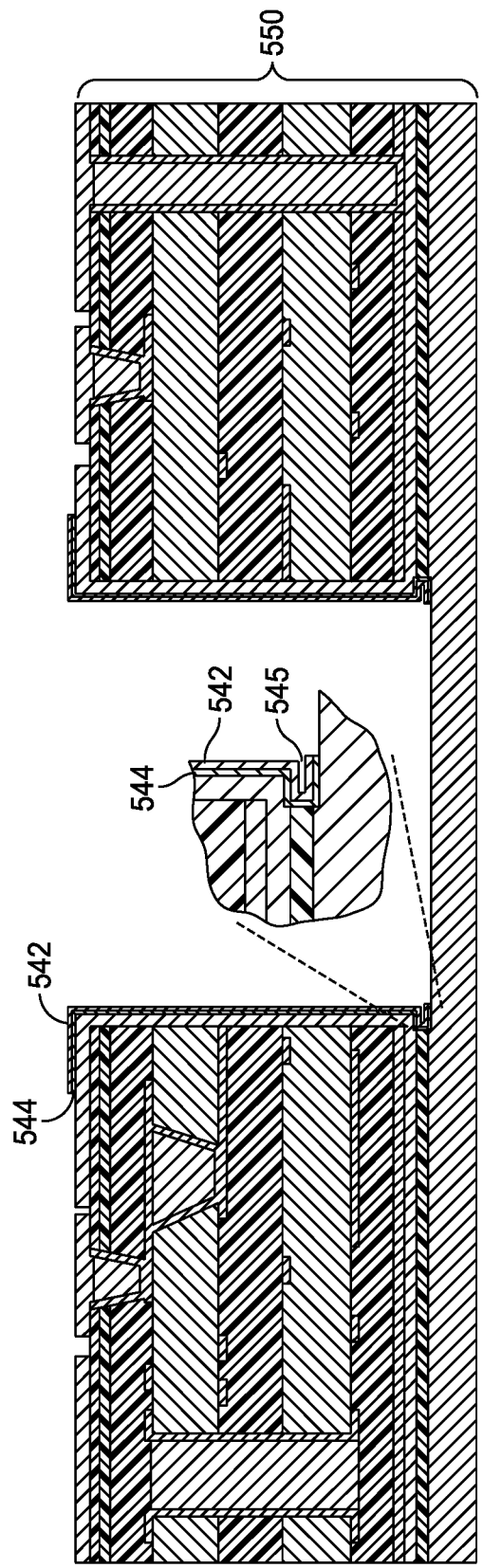

A further embodiment illustrated in FIG. 7 is also shown in the abbreviated fabrication sequence from 8A through 8H. This further embodiment shows the plated sidewall pocket 52 formed in a board 520 prior to attachment of a copper cold plate 534. As shown in FIG. 8E, a multilayer assembly 530 is attached to the thermal and electrical ground plane with the electrically and thermally conductive film adhesive 533 cut with an aperture 536 in the film adhesive. The aperture 536 provides for subsequent attachment of the thermal pedestal 56 shown in FIG. 7 to the cold plate 534. The configuration shown in FIG. 8E simplifies the cavity machining operation as the cold plate 534 is not yet attached to the multilayer assembly 530. However, in the configuration of the multilayer assembly 540 shown in FIG. 8F, moisture can permeate laterally through the relatively high moisture permeability of the commonly used epoxy film adhesive 533. To seal the high permeability moisture path, a second nanolaminate coating 542 can be applied as shown in FIG. 8H. A conformal polymer layer such as parylene 544 may also be provided beneath the nanolaminate layer to effectively seal and smooth the internal cut edges of the thermally conductive film adhesive 533.

Figure 9:
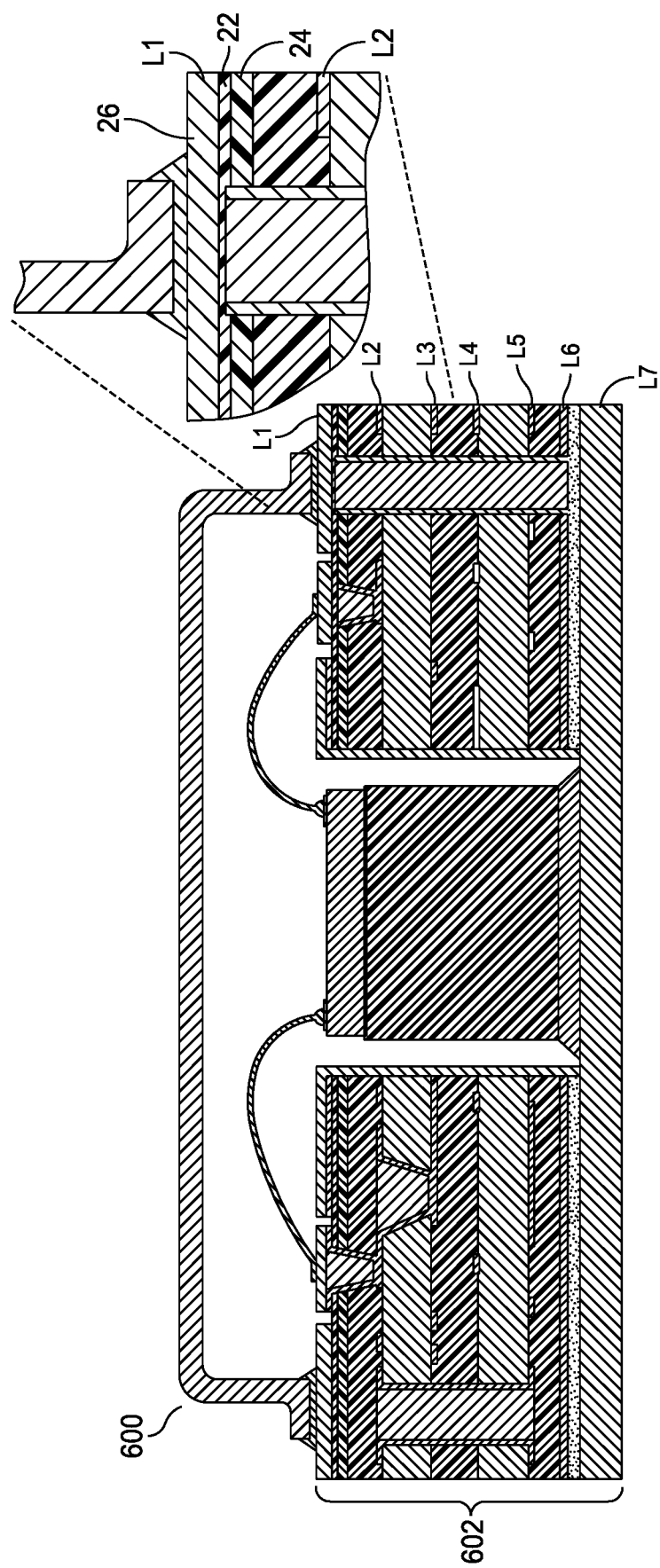
FIG. 9 shows yet another embodiment simplifying construction of the hermetic chip on board architecture for very high-power devices.

FIG. 9 is another embodiment similar to that shown in FIG. 7 except that the low permeability homogeneous sealing layer 22 of the multilayer circuit board assembly 600 is positioned between the top metal layer 26 and the bottom nanolaminate layer 24. The fabrication sequence is then similar to that shown in FIGS. 8A through 8H. One benefit of the embodiment shown in FIG. 9 is similar to the benefit of the embodiment shown in FIG. 7. Positioning of the nanolaminate layer 24 below the low permeability sealing layer 22 eliminates the need for selectively removing the nanolaminate from the patterned top metallization layer and allows the nanolaminate layer 24 to be included as an integral low permeability laminate film 602 as shown in FIG. 10A. The benefit of the integral film is that commercially available metallized low permeability film such as LCP or PCTFE can be cost effectively be nanolaminate coated with reel to reel or batch panel coating systems. By utilizing relatively thin low permeability film less than ten mils in thickness associated with this embodiment, the lateral permeability of moisture through the LCP film can be reduced by an order of magnitude or more below the required military and industrial standards for hermeticity. A further embodiment of a structure 612 shown in FIG. 9 is shown in FIG. 10B, where the prepreg film 604 may be included as an integral layer of the low permeability laminate film. The benefit of the embodiment of FIG. 10B is that the nanolaminate layer is physically protected from damage prior to lamination to the core multilayer circuit board 606. The prepreg film 604 in the laminate film 602 may also be replaced by a lower melt, low permeability film such as LCP or PCTFE.

Figure 11:
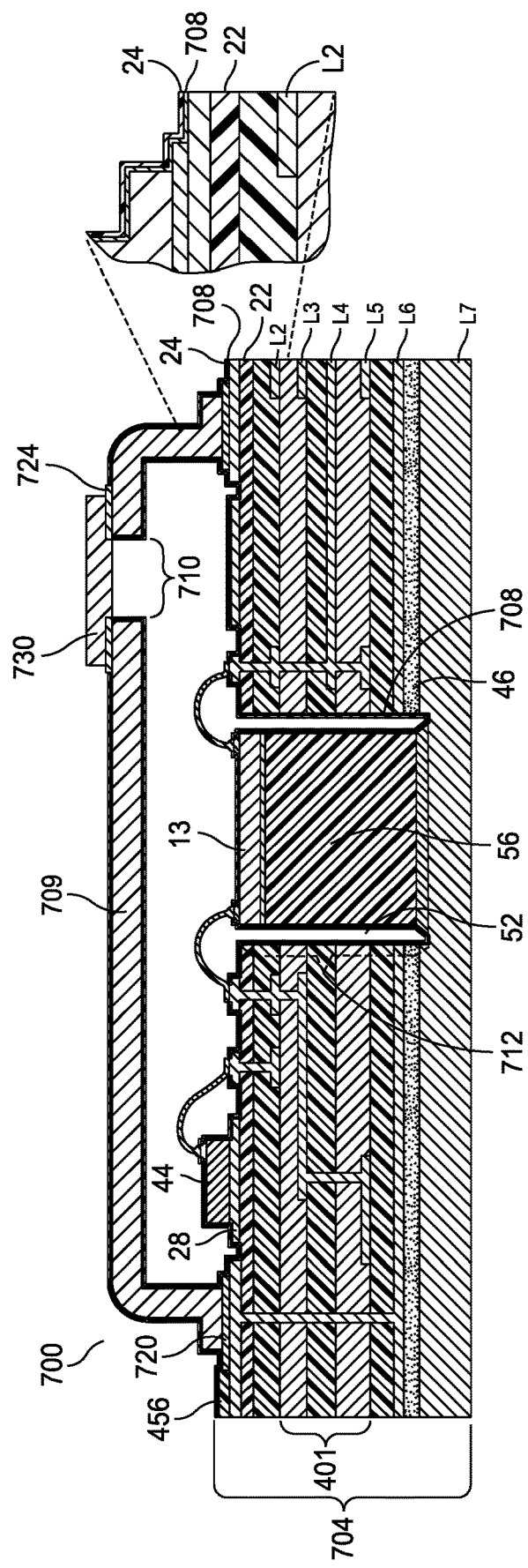
FIG. 11 is yet another embodiment of the hermetic chip on board assembly for high power devices providing simplified fabrication and improved reliability.

Referring to FIG. 11, another embodiment of a printed circuit board assembly, generally indicated at 700, is illustrated. The configuration shown in FIG. 11 is similar to that shown in FIG. 5 except that the sidewalls 712 of the cavity 52 are not plated. To prevent moisture ingression through the cavity sidewalls 712, the cavity region is coated with a low permeability polymer sealing layer 708 followed by an inorganic nanolaminate coating 24. The low permeability conformal polymer coating seals the exposed edges of the laminate layers and the electrically conductive adhesive 46 and provides a smooth defect free surface for the nanolaminate coating 24. In the embodiment shown in FIG. 11, the low permeability polymer coating 708 and nanolaminate coating 24 are applied after assembly of the components including the thermal spreader pedestal 56, electrical component 44, electrical component 13 and component lid 709. Low permeability conformal coatings include materials such as parylene C, parylene D and preferably parylene AF4 or parylene HT®. Conformal coating may also be a requirement to provide uniform thickness coverage within the cavity sidewall region and recessed regions 545, such as that shown in FIG. 8H, where the film adhesive 64 may be pulled back from the cavity pocket region 52. While the embodiment shown in FIG. 11 is realized by coating through the lid aperture 710 prior to sealing the aperture 710, the low permeability polymer 708 and inorganic coatings 24 may alternately be deposited prior to assembly and selectively patterned by masking, laser ablation or other means.

In the embodiment shown in FIG. 11, the low permeability polymer coating 708 and nanolaminate coating 24 are applied using the highly conformal low permeability parylene and the inorganic atomic layer deposited nanolaminate prior to sealing the lid hole 710 with the lid hole cap 730. The lid 709 and lid hole cap 730 may be sealed with solder 724 that may be applied using a solder preform, solder paste or other means. The embodiment shown in FIG. 11 eliminates the need for selective patterning of the nanolaminate and provides both package hermeticity and protection against cavity internal foreign objects via the parylene and nanolaminate coating. An abbreviated process flow for the embodiment is shown in FIGS. 12A through 12D. As shown in FIG. 12A, solder 720 is screen printed or otherwise attached to the board assembly metallization region 26 immediately beneath the lid seal flange 705. If used, the screen printed solder 720 may be reflow attached and cleaned prior to conductive adhesive assembly of the components internal to the hermetic cavity to eliminate the potential of flux residue. A solder preform attached to the lids seal flange 705 or on the flange metallization region of a circuit board 704 may alternately be used. After placement and solder attachment of the lid 709 to the circuit board 704, the assembly 704 is coated with the low permeability polymer coating 708 and the nanolaminate layer 24 as shown in FIG. 12B. After nanolaminate coating 24 of the assembly, the low permeability polymer 708 and nanolaminate coating 24 are selectively removed around a hole lid region 722 as shown in FIG. 12C. After coating removal around the lid hole region 722, the lid hole is sealed with the lid cap 730 using solder 724 as shown in FIG. 12D. Welding of the lid hole cap 730 may also be utilized to seal the lid hole.

Figure 13:
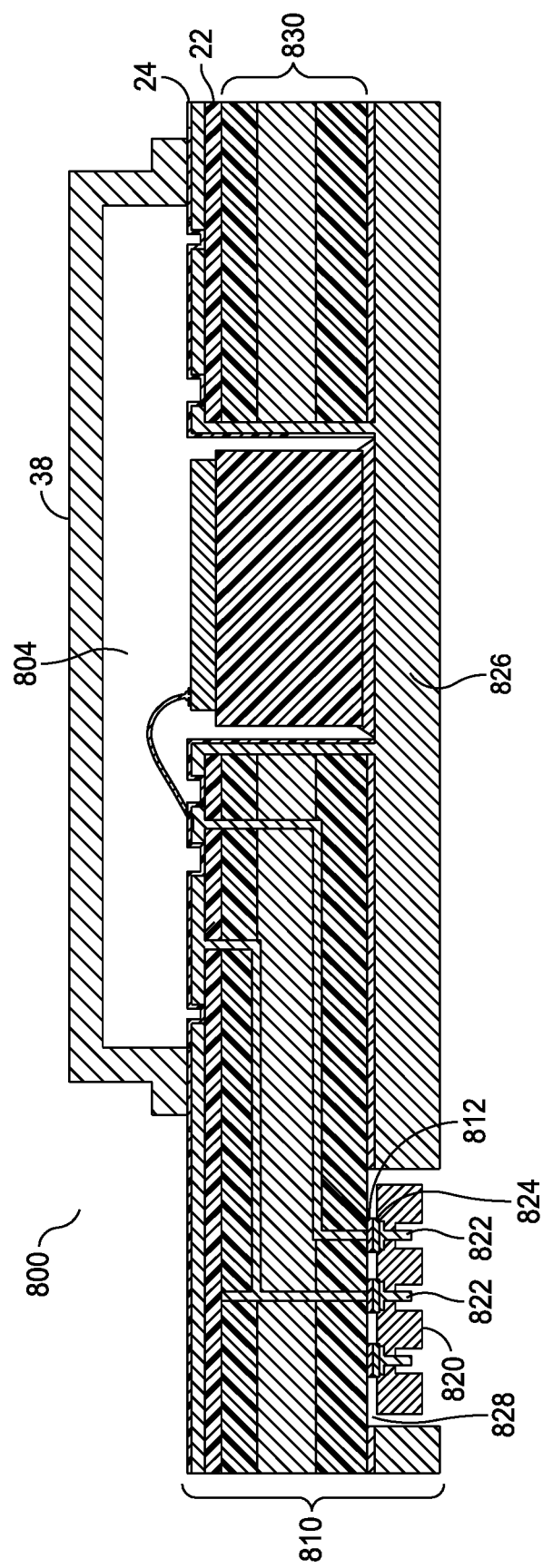
FIG. 13 is a cross-sectional view of an embodiment showing a construction for providing hermetic input and output connections to the hermetic chip on board enclosure.

FIG. 13 is an embodiment illustrating the method by which input and output connections 822 are made to the internal hermetic cavity 804 of the electronic assembly 800. As shown in FIG. 8, the connections may be made through the backside of the circuit board assembly 810 through a connector 820 and associated connector pins 822 and solder 824 attached to metallization pads 812 on the backside of the circuit board. Input and output connections to the hermetic cavity may similarly be made on the front side of the circuit board assembly. A benefit of the low permeability homogeneous sealing layer 22 in conjunction with the nanolaminate coating 24 is that the backside thermal and electrical ground plane or cold plate 826 is not required to prevent moisture from ingression through the exposed connector pin regions 828 or circuit board sidewalls 828.

Figure 14:
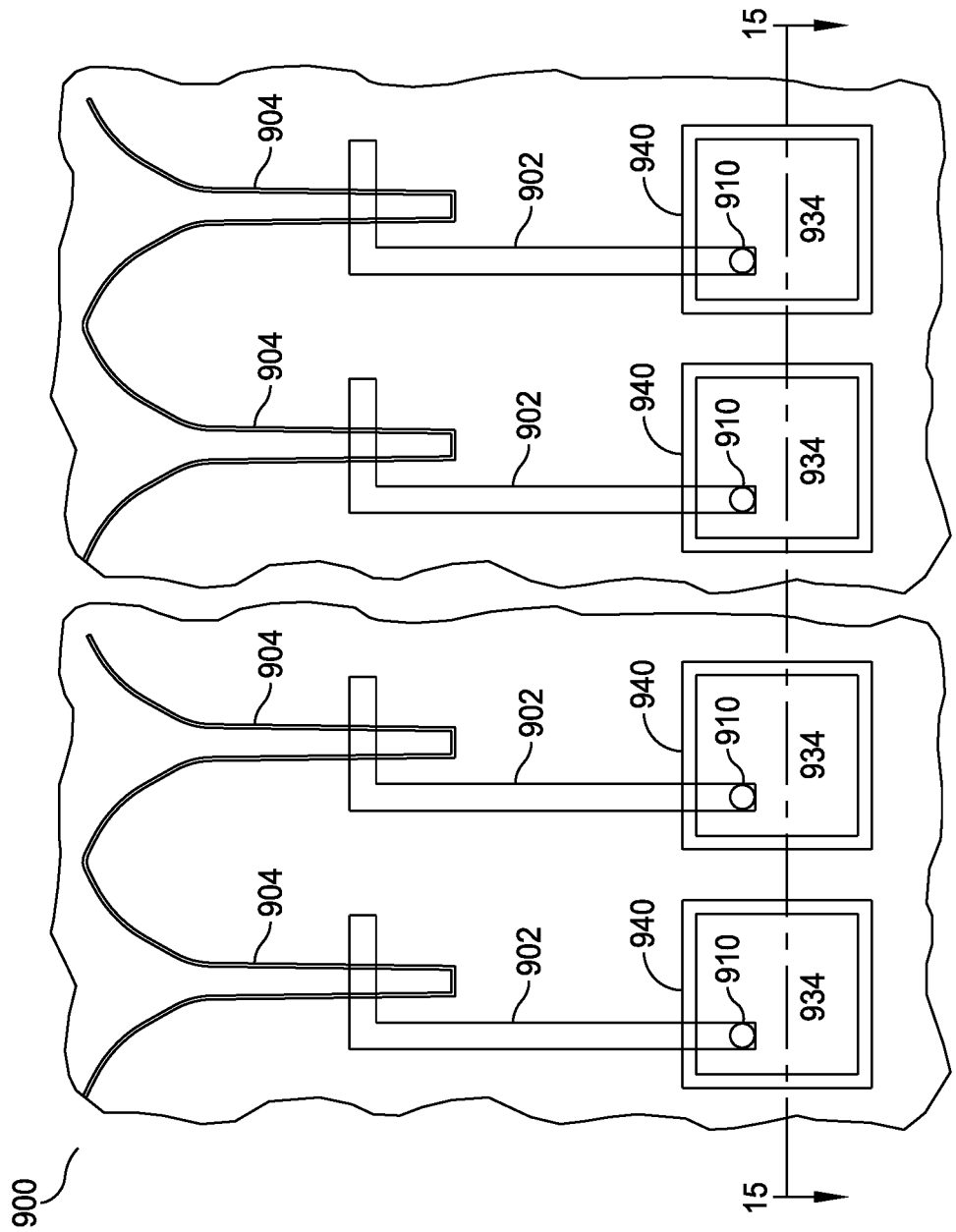
FIG. 14 is a plan view of an embodiment for active electronically scanned array radar applications.
Figure 15:
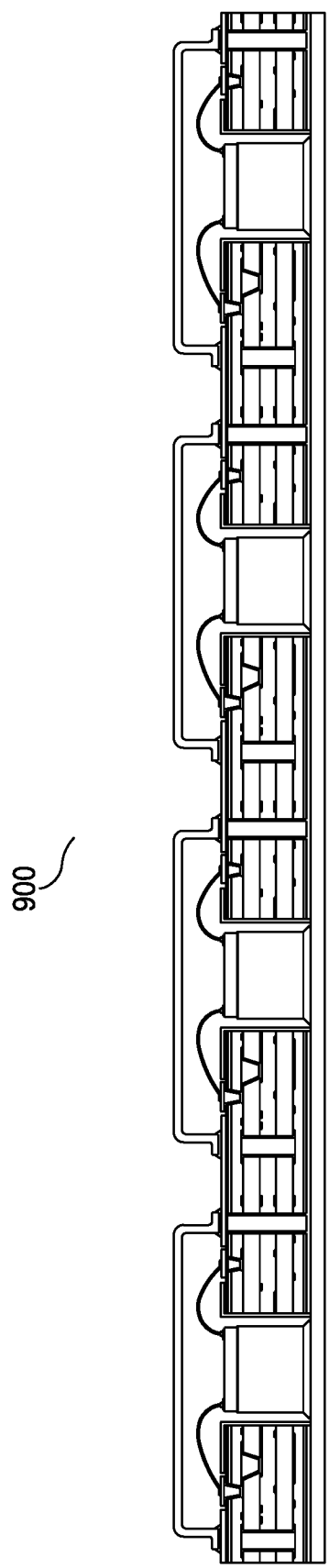
FIG. 15 is a cross-sectional view of the embodiment for active electronically scanned array radar applications.

FIGS. 14 and 15 illustrates a printed circuit board assembly, generally indicated at 900, in which multiple channels can be simultaneously fabricated and subsequently assembled for an active electronic scanned array (AESA) consisting of transmit and/or receive integrated microwave module (TRIMM) or panel arrays. The TRIMM consists of a linear array of channels at a spacing between the channels determined by the AESA wavelength. FIG. 14 shows a planar view of a TRIMM assembly 900. FIG. 15 shows a sectional view A-A taken through the hermetic channels 934 of FIG. 14. As shown in the embodiment of FIG. 14, the channels are integrated on a single board with integral notch radiators 904. The topside and underside surfaces of the circuit board assembly in the area of the hermetic cavities 934 and notch radiator 904 are metallized. The hermetic seal ring 940 is also shown in FIG. 14. Within the channel 934, input and output signals are routed to the electronic circuitry within the hermetic cavity through transmission lines 902 buried in the multilayer circuit board and through RF vias 910. The embodiments provided herein enable a high density, light weight, low cost and hermetically protected AESA array.

The panel array may consist of an areal or two-dimensional array of channels with the radiating elements aligned normal to the plane of the multilayer circuit board assembly. Tens or even hundreds of channels may be included on a single multilayer substrate. In the TRIMM configuration, the linear channel array is stacked to form a two-dimensional array of radiating elements. As such, the modules must be closely spaced and at higher frequencies there is insufficient space on the circuit board for individual hermetic packages to maintain the required spacing. Both the height and width of hermetic packages is significantly greater due to the increased thickness of the sidewalls for hermetic packages and increased area and height for package to board interconnections. The hermetic chip on board embodiments shown in this disclosure provide a means to realize the close spacing of AESA channels while maintaining board hermeticity and associated reliability. Further the embodiments shown allow significant reductions in cost and weight through elimination of the individual hermetic enclosures and the elimination of associated serial assembly and test labor.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A low permeability laminate film comprising:
   one or more low moisture permeability homogeneous polymer films with a total thickness between 0.5 and ten mils without glass or ceramic fillers and with a moisture permeability measured at 37° C. and 100% RH of less than 0.23 gm mm/m$^2$ day equivalent to a standard leak rate of 2.6 E-05 atm·cc·mm/in$^2$·sec of air, the polymer film including one of thermotropic liquid crystal polymer, polychlorotrifluoroethylene, polytetrafluoroethylene, fluorinated ethylene propylene, and perfluoro alkoxy alkane; and
   a nanolaminate including alternate combinations of nanolaminate material that is selected from the group consisting of alumina, titanium dioxide, zirconium oxide, beryllium oxide, hafnium oxide, titanium oxide, silicon nitride, tantalum nitride, silica, parylene F, parylene AF-4, parylene and PTFE (polytetrafluoroethylene),
   wherein a resulting coated nanolaminate film has a moisture permeability that may be less than an equivalent standard leak rate per square inch of 3.0 E-08 atm·cc/in$^2$·sec of air.

2. A printed circuit board laminate produced with the low permeability laminate film of claim 1, wherein the low permeability laminate film is metallized with copper or other metallization and selectively etched and the nanolaminate coating is placed on top of the patterned copper using atomic layer deposition.

3. A free-standing printed circuit board laminate produced with the low permeability laminate film of claim 1, wherein the polymer film is coated with nanolaminate and metallization is deposited on top of the nanolaminate.

4. A hermetic electronic, optical or electro-mechanical assembly produced with the free-standing printed circuit board laminate of claim 3, wherein the low permeability laminate film is laminated to a non-homogeneous multilayer circuit board and the resulting construction is comprised of the following elements:
   a non-homogeneous organic based multilayer substrate such as an epoxy-filled with glass and/or other ceramic based materials with metallization and via interconnections;
   a metallized and patterned top layer on the low permeability laminate film providing for a hermetic seal ring, metallization regions for one or more components, copper-filled vias for input and output routing of signals from within the hermetic enclosure;
   a cavity formed by laser and/or mechanically machined through the multilayer circuit, with cavity sidewalls and backside of the multilayer circuit board being metallized with copper;
   a film or paste adhesive having a laser- or mechanically-removed region in the film or paste adhesive aligning with the cavity cut in the multilayer board;

a thermal and/or electrical ground backplane made of copper or other high thermal conductivity materials and joined to the cavity cut and plated multilayer board with the electrically and thermally conductive paste or film adhesive;

a deposited low permeability conformal coating with a moisture permeability measured at 37° C. and 100% RH of less than an equivalent leak rate of 2.6 E-05 atm·cc·mm/in$^2$·sec·of air followed by the atomic layer deposited nanolaminate layer and an optional second low permeability conformal coating with the same moisture permeability;

one or more components attached and interconnected to the etched metallization regions with the low permeability polymer and nanolaminate layers selectively removed in the regions for component attachment and interconnect and lid sealing; and an impermeable metal, ceramic or glass lid enclosure solder or otherwise hermetically attached to the metallized seal ring.

5. A method of producing the hermetic electronic, optical or electro-mechanical assembly of claim 4 comprising the following steps:

laminating the free-standing metallized low permeability laminate with the nanolaminate formed between the metallization and low permeability film to the inner multilayer core;

etching through, buried and blind copper-filled vias in the top metallization layer to form the conductive traces and the lid seal metallization region;

laser or mechanically drilling and plating cavities;

mechanically or laser cutting the backplane film adhesive and pulling back from the cavity region to allow for adhesive flow during backplane lamination;

attaching the thermal and/or electrical backplane to the backside of the multilayer structure with electrically conductive past or film adhesive;

applying a low permeability sealing layer nanolaminate to the multilayer board structure and selectively etching in regions for component attachment, interconnect and hermetic lid sealing; and attaching and interconnecting one or more components to the etched metallization regions with the nanolaminate selectively removed in the regions for component attachment and interconnection and for hermetic lid sealing.

6. A hermetic electronic, optical or electro-mechanical assembly produced with the free-standing printed circuit board laminate of claim 3, wherein the free-standing homogeneous, low permeability laminate film is laminated to a non-homogeneous multilayer circuit board and the resulting construction is comprised of the following elements except with the absence of the deposited and selectively removed polymer conformal coating and atomic layer deposited nanolaminate coating:

a non-homogeneous organic based multilayer substrate such as an epoxy-filled with glass and/or other ceramic based materials with metallization and via interconnections;

a metallized and patterned top layer on the low permeability laminate film providing for a hermetic seal ring, metallization regions for one or more components, copper-filled vias for input and output routing of signals from within the hermetic enclosure;

a cavity laser and/or mechanically cut through the multilayer circuit and the cavity sidewalls and backside of the multilayer circuit board metallized with copper;

a low moisture permeability homogeneous polymer film with an equivalent standard leak rate of less than 2.6 E-05 atm·cc·mm/in$^2$·sec·of air with a laser or mechanically removed region in the film adhesive aligning with the cavity cut in the multilayer board a thermal and/or electrical ground backplane made of copper or other high thermal conductivity materials and joined to the cavity cut and plated multilayer board with the low moisture permeability film adhesive;

one or more components attached and interconnected to the etched metallization regions with the low permeability polymer and nanolaminate layers selectively removed in the regions for component attachment and interconnect and lid sealing; and an impermeable metal, ceramic or glass lid enclosure solder or otherwise hermetically attached to the metallized seal ring.

7. A free-standing printed circuit board laminate produced with the low permeability laminate film of claim 1, wherein one side of the polymer film is coated with copper and the opposite side of the polymer film is coated with nanolaminate.

8. A hermetic electronic, optical or electro-mechanical assembly produced by the free-standing printed circuit board laminate of claim 7, wherein the low permeability laminate film is laminated to a non-homogeneous multilayer circuit board and the resulting construction is comprised of the following elements:

a non-homogeneous organic based multilayer substrate which may include an epoxy or modified epoxy-filled with glass and/or other ceramic based materials with metallization and via interconnections;

a thermal and/or electrical ground backplane or cold plate made of copper or other high thermal conductivity materials and joined to the multilayer board with an electrically and thermally conductive paste or film adhesive;

a cavity cut into the multilayer circuit board to the thermal backplane or cold plate with the cavity sidewalls metallized with copper making contact to the copper thermal and electrical backplane;

a metallized and patterned top layer on the low permeability laminate film providing for a hermetic seal ring, metallization regions for one or more components, copper-filled vias for input and output routing of signals from within the hermetic enclosure;

one or more components attached and interconnected to the etched metallization regions with the nanolaminate selectively removed in the regions for component attachment and interconnection and for hermetic lid sealing; and an impermeable metal, ceramic or glass lid enclosure solder or otherwise hermetically attached to the metallized seal ring.

9. A free-standing printed circuit laminate produced with the low permeability laminate film of claim 7, wherein the nanolaminate is coated or laminated with a second polymer layer which may be a thermoplastic or thermosetting printed circuit board prepreg layer.

10. A hermetic electronic, optical or electro-mechanical assembly produced with the free-standing printed circuit laminate of claim 9, wherein the low permeability laminate film is laminated to a non-homogeneous multilayer circuit board and the resulting construction is comprised of the following elements:

a non-homogeneous organic based multilayer substrate such as an epoxy-filled with glass and/or other ceramic based materials with metallization and via interconnections;

a metallized and patterned top layer on the low permeability laminate film providing for a hermetic seal ring, metallization regions for one or more components, copper-filled vias for input and output routing of signals from within the hermetic enclosure;

a thermal and/or electrical ground backplane or cold plate made of copper or other high thermal conductivity materials and joined to the multilayer board with an electrically and thermally conductive paste or film adhesive;

a cavity cut into the multilayer circuit board to the thermal backplane or cold plate with the cavity sidewalls metallized with copper making contact to the copper thermal and electrical backplane;

one or more components attached and interconnected to the etched metallization regions with the nanolaminate selectively removed in the regions for component attachment and interconnection and for hermetic lid sealing; and an impermeable metal, ceramic or glass lid enclosure solder or otherwise hermetically attached to the metallized seal ring.

11. A hermetic electronic, optical or electro-mechanical assembly produced with the low permeability laminate film of claim 1, wherein the low permeability homogeneous laminate film is laminated to a non-homogenous multilayer circuit board and the resulting construction is comprised of the following elements:

an organic based multilayer substrate including an epoxy or modified epoxy-filled with glass and/or other ceramic based materials with metallization and via interconnections;

a metallized and patterned top layer on the low permeability laminate film providing for a hermetic seal ring, metallization regions for one or more components, copper-filled vias for input and output routing of signals from within the hermetic enclosure;

a nanolaminate coating applied to the etched metallization and selectively removed in regions for component attachment and interconnection and for hermetic lid sealing;

one or more components attached and interconnected to the etched metallization regions where the nanolaminate is selectively removed; and an impermeable metal, ceramic or glass lid enclosure solder or otherwise hermetically attached to the metallized seal ring.

12. A hermetic electronic, optical or electro-mechanical assembly produced with the low permeability laminate film of claim 1, wherein the low permeability laminate film is laminated to a non-homogeneous multilayer circuit board and the resulting construction is comprised of the following elements:

an organic based multilayer substrate constructed in part of non-homogeneous laminate layers including glass and/or mineral-filled epoxy or modified epoxy;

a metallized and patterned top layer on the low permeability laminate film providing for a hermetic seal ring, metallization regions for one or more components, copper-filled vias for input and output routing of signals from within the hermetic enclosure;

copper-filled thermal vias routed to a copper thermal backplane with the thermal backplane attached with thermally and electrically conductive film or paste adhesive;

the nanolaminate coating applied by atomic layer deposition to the etched metallization and selectively removed in regions for component attachment and interconnection and for hermetic lid sealing;

one or more components attached and interconnected to the etched metallization regions where the nanolaminate is selectively removed; and an impermeable metal, ceramic or glass lid enclosure solder or otherwise hermetically attached to the metallized seal ring.

13. A hermetic electronic, optical or electro-mechanical assembly produced with the low permeability laminate film of claim 1, wherein the low permeability laminate film is laminated to a non-homogeneous multilayer circuit board and the resulting construction is comprised of the following elements:

an organic-based multilayer substrate including laminate epoxy-based layers filled with glass and/or ceramic based materials with patterned metallization and via interconnections;

a low permeability laminate film coated with nanolaminate with metallization being deposited on top of the nanolaminate;

a metallized and patterned top layer on the low permeability laminate film providing for a hermetic seal ring, metallization regions for one or more components, copper-filled vias laser or otherwise drilled for input and output routing of signals from within the hermetic enclosure;

copper-filled thermal vias routed to a copper thermal backplane with the thermal backplane attached with thermally and/or electrically conductive film or adhesive;

one or more components attached and interconnected to the etched metallization regions where the nanolaminate is selectively removed; and an impermeable metal, ceramic or glass lid enclosure solder or otherwise hermetically attached to the metallized seal ring.

14. A hermetic electronic, optical or electro-mechanical assembly produced with the low permeability laminate film of claim 1, wherein the low permeability homogeneous laminate film is laminated to a non-homogeneous multilayer circuit board and the resulting construction is comprised of the following elements:

an organic based multilayer substrate including an epoxy-filled with glass and/or other ceramic based materials with metallization and via interconnections;

a thermal and/or electrical ground backplane made of copper or other high thermal conductivity materials and joined to the multilayer board with an electrically and thermally conductive paste or film adhesive;

a cavity cut into the multilayer circuit board to the thermal backplane with the cavity sidewalls metallized with copper making contact to the copper thermal and electrical backplane;

a metallized and patterned top layer on the low permeability laminate film providing for a hermetic seal ring, metallization regions for one or more components, copper-filled vias for input and output routing of signals from within the hermetic enclosure;

the nanolaminate coating applied to the etched metallization and sidewall cavity regions selectively removed in regions for component attachment and interconnect on the topside of the board, within the cavity floor and on the lid metallization region;

one or more components attached and interconnected to the etched metallization regions with the nanolaminate selectively removed in the regions for component attachment and interconnection and for hermetic lid sealing; and an impermeable metal, ceramic or glass lid enclosure solder or otherwise hermetically attached to the metallized seal ring.

15. A method of producing hermetic electronic, optical or electro-mechanical assembly of claim 14 comprising the following steps:

laminating the free-standing metallized low permeability homogeneous laminate to the inner multilayer core, the low permeability laminate film being metallized with copper or other metallization and selectively etched and the nanolaminate coating is placed on top of the patterned copper using atomic layer deposition;

etching through, buried and blind copper-filled vias in the top metallization layer to form the conductive traces and the lid seal metallization region;

attaching the thermal and/or electrical backplane to the backside of the multilayer structure with electrically conductive past or film adhesive;

laser or mechanically drilling cavities through the backplane adhesive and the cavity base and plated sidewalls;

applying the low permeability nanolaminate layer to the multilayer board structure and selectively etched in regions for component attachment, interconnect and hermetic lid sealing;

attaching one or more components are attached and interconnected to the etched metallization regions with the nanolaminate selectively removed in the regions for component attachment and interconnection and for hermetic lid sealing; and an impermeable metal, ceramic or glass lid enclosure is solder or otherwise hermetically attached to the metallized seal ring.

16. A hermetic electronic, optical or electro-mechanical assembly produced with the low permeability laminate film of claim 1, wherein the low permeability laminate film is laminated to a non-homogeneous multilayer circuit board and the resulting construction is comprised of the following elements:

an organic based multilayer substrate including an epoxy-filled with glass and/or other ceramic based materials with metallization and via interconnections;

a metallized and patterned top layer on the low permeability laminate film providing for a hermetic seal ring, metallization regions for one or more components, copper-filled vias for input and output routing of signals from within the hermetic enclosure;

a thermal and/or electrical ground backplane or cold plate made of copper or other high thermal conductivity materials and joined to the multilayer board with an electrically and thermally conductive paste or film adhesive;

a cavity laser or mechanically cut into the multilayer circuit board to the thermal backplane without subsequent cavity sidewall metallization;

one or more components attached and interconnected to the etched metallization regions and to the thermal backplane;

an impermeable metal, ceramic or glass lid enclosure solder or otherwise hermetically attached to the metallized seal ring with an aperture in the lid for through hole coating;

a deposited low permeability conformal coating applied through the lid aperture with a moisture permeability measured at 37° C. and 100% RH of less than an equivalent leak rate of 2.6 E-05 atm·cc·mm/in$^2$·sec of air followed by the atomic layer deposited nanolaminate layer and an optional second low permeability conformal coating with the same moisture permeability; and the nanolaminate conformal coating selectively removed around the topside of the aperture and a lid cap solder, welded or otherwise hermetically sealed to the lid region.

17. A hermetic electronic, optical or electro-mechanical assembly produced with the low permeability laminate film of claim 1, wherein the exposed dielectric surface area within the hermetic enclosure is reduced to less than 50% through flooding of the dielectric layer with metal.

18. An active electronically scanned array of hermetic enclosures produced with the low permeability laminate film of claim 1, wherein the enclosures are spaced in a linear or areal array on a spacing dictated by radar wavelength.

* * * * *